United States Patent
Lin et al.

(10) Patent No.: US 10,628,259 B2
(45) Date of Patent: Apr. 21, 2020

(54) BIT DETERMINING METHOD, MEMORY CONTROL CIRCUIT UNIT AND MEMORY STORAGE DEVICE

(71) Applicant: PHISON ELECTRONICS CORP., Miaoli (TW)

(72) Inventors: Wei Lin, Taipei (TW); An-Cheng Liu, Taipei (TW); Yu-Siang Yang, New Taipei (TW); Yu-Cheng Hsu, Yilan County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 74 days.

(21) Appl. No.: 16/120,314

(22) Filed: Sep. 3, 2018

(65) Prior Publication Data
US 2020/0034232 A1    Jan. 30, 2020

(30) Foreign Application Priority Data
Jul. 24, 2018    (TW) .............................. 107125570 A

(51) Int. Cl.
  *G06F 11/10* (2006.01)
  *G11C 29/52* (2006.01)
  *H03M 13/45* (2006.01)

(52) U.S. Cl.
  CPC .......... *G06F 11/1068* (2013.01); *G11C 29/52* (2013.01); *H03M 13/45* (2013.01)

(58) Field of Classification Search
  CPC .............................. G06F 11/1068; G11C 29/52
  See application file for complete search history.

(56) References Cited

U.S. PATENT DOCUMENTS

| | | | |
|---|---|---|---|
| 2009/0016103 A1* | 1/2009 | Kang ................... | G06F 11/1068 365/185.03 |
| 2009/0241009 A1* | 9/2009 | Kong ................... | G06F 11/1072 714/763 |
| 2012/0236641 A1* | 9/2012 | Hu ....................... | G11C 11/5642 365/185.03 |
| 2015/0248326 A1* | 9/2015 | Fitzpatrick .......... | G06F 11/1068 714/6.11 |
| 2018/0048329 A1* | 2/2018 | Ha ....................... | G06F 11/1012 |

* cited by examiner

*Primary Examiner* — Joseph D Torres
(74) *Attorney, Agent, or Firm* — JCIPRNET

(57) ABSTRACT

A bit determining method, a memory control circuit unit and a memory storage device are provided. The method includes: reading a first storage state of a first memory cell to obtain a first value of a first significant bit; reading the first storage state of the first memory cell to obtain at least one second value of at least one second significant bit; performing a first decoding operation according to the at least one second value to obtain at least one third value of the decoded second significant bit; determining whether the first significant bit is a special bit according to the first storage state and a second storage state corresponding to the at least one third value; and if the first significant bit is the special bit, performing a corresponding decoding operation.

24 Claims, 17 Drawing Sheets

| Lower physical programming unit | Center physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

FIG. 11

BIT DETERMINING METHOD, MEMORY CONTROL CIRCUIT UNIT AND MEMORY STORAGE DEVICE

CROSS-REFERENCE TO RELATED APPLICATION

This application claims the priority benefit of Taiwan application serial no. 107125570, filed on Jul. 24, 2018. The entirety of the above-mentioned patent application is hereby incorporated by reference herein and made a part of this specification.

BACKGROUND OF THE INVENTION

Field of the Invention

The invention relates to a bit determining method, a memory control circuit unit and a memory storage device.

Description of Related Art

Digital cameras, mobile phones and MP3 players have grown rapidly in recent years, and consumer's demand for storage media is also rapidly increased. Since a rewritable non-volatile memory module (for example, a flash memory) has features of non-volatile, power-saving, small volume and non-mechanical structure, etc., it is very suitable for being built-in the aforementioned various portable multimedia devices.

In general, to ensure the correctness of the data stored in the rewritable non-volatile memory module, the data is encoded before storing the data into the rewritable non-volatile memory module. The encoded data (including the original data and the error correction code) is stored into the rewritable non-volatile memory module. Thereafter, the encoded data can be read from the rewritable non-volatile memory module and decoded to correct errors that may exist therein. In the past, error correction codes mostly use algebraic decoding algorithms, such as BCH code. In current probability decoding algorithms, such as low density parity codes (hereinafter also referred to as LDPC), are gradually maturing. The low density parity check code uses a sparse matrix to encode and decode.

The LDPC code is usually defined as a parity-check matrix and can be represented by using a bipartite graph. The bipartite graph is related to a Tanner graph. A bipartite graph is a graph composed of a plurality of vertices. The vertices are divided into two different types, and the LDPC code is represented by a bipartite graph composed by a plurality of vertices. Some of these vertices are called variable nodes, while other vertices are called check nodes. The variable nodes are mapped one-to-one to the encoded data bits (also known as codewords). The variable nodes can also be known as message nodes or bit nodes. The check nodes can also be known as parity nodes.

In general, the LDPC decoder decodes via unsatisfied check node information or log-likelihood ratio (LLR) in an iterative decoding operation.

However, in terms of bit error rate, problems such as High Reliable Error (hereinafter also referred to as HRE) may be encountered in the process of iterative decoding. The HRE may be caused by a bus error or a problem occurred in manufacturing a rewritable non-volatile memory. It causes that if the memory controller intends to program a memory cell to a storage state, the actual storage state of the memory cell after being programmed is another storage state that is greatly different from the originally expected storage state. For example, if the memory controller wants to program a memory cell to the storage state of "110", the actual storage state of the memory cell after being programmed is "010". In a distribution map of storage states, the storage state having a value of "110" and the storage state having the value "010" are not adjacent to each other and are separated from each other by one or more storage states. In other words, if the memory cell is programmed and its actual storage state is another storage state that is significantly different from the originally expected storage state and the two storage states in the distribution map of storage states of the rewritable non-volatile memory are not adjacent to each other and are separated from each other by a plurality of storage states, it can be determined that the rewritable non-volatile memory generates HRE. In general, if performing LDPC decoding using a bit belonging to HRE (hereinafter referred to as HRE bit), the error floor region of the bit error rate and the decoding converging speed may be decreased and it may cause decoding to fail. Therefore, how to detect the HRE bit and solve the divergent log likelihood ratio (hereinafter also referred to as LLR) according to the detected HRE bit to improve the performance of the LDPC decoding is a topic of interest to those skilled in the art.

SUMMARY OF THE INVENTION

The present invention provides a bit determining method, a memory control circuit unit, and a memory storage device that can identify a special bit (e.g., HRE bit) in a data. In addition, the decoding parameter corresponding to the special bit can also be adjusted to a specific decoding parameter, thereby preventing the special bit from affecting the decoding of other bits in the decoding process and improving the probability of success in decoding.

The present invention provides a bit determining method, which is adapted to a rewritable non-volatile memory module, wherein the rewritable non-volatile memory module includes a plurality of memory cells, each of the plurality of memory cells has one of a plurality of storage states, each of the plurality of storage states having a plurality of significant bits. The bit determining method includes: reading, by a memory management circuit, a first storage state of a first memory cell in the plurality of memory cells to obtain a first value of a first significant bit of the first storage state; reading, by the memory management circuit, the first storage state of the first memory cell to obtain at least one second value of at least one second significant bit of the first storage state; performing, by an error checking and correcting circuit, a first decoding operation according to the at least one second value to obtain at least one third value of the decoded second significant bit; determining, by the memory management circuit, whether the first significant bit is a special bit according to the first storage state and a second storage state corresponding to the at least one third value; and if the first significant bit is the special bit, performing, by the error checking and correction circuit, a corresponding decoding operation.

The invention provides a memory control circuit unit, which is adapted to a rewritable non-volatile memory module, wherein the rewritable non-volatile memory module includes a plurality of memory cells, each of the plurality of memory cells has one of a plurality of storage states, each of the plurality of storage states having a plurality of significant bits. The memory control circuit unit includes a host interface, a memory interface and a memory management circuit. The host interface is coupled to a host system. The memory interface is coupled to the rewritable non-volatile memory module. The memory management circuit is coupled to the host interface and the memory interface. The memory management circuit executes following operations: reading a first storage state of a first memory cell in the plurality of memory cells to obtain a first value of a first significant bit of the first storage state; reading the first storage state of the first memory cell to obtain at least one second value of at least one second significant bit of the first storage state; performing a first decoding operation according to the at least one second value to obtain at least one third value of the decoded second significant bit; determining whether the first significant bit is a special bit according to the first storage state and a second storage state corresponding to the at least one third value; and if the first significant bit is the special bit, performing a corresponding decoding operation.

The invention provides a memory storage device, the memory storage device includes a connection interface unit, a rewritable non-volatile memory module and a memory control circuit unit. The connection interface unit is coupled to a host system. The rewritable non-volatile memory module includes a plurality of memory cells, each of the plurality of memory cells has one of a plurality of storage states and each of the plurality of storage states having a plurality of significant bits. The memory control circuit unit is coupled to the connection interface unit and the rewritable non-volatile memory module. The memory control circuit unit executes following operations: reading a first storage state of a first memory cell in the plurality of memory cells to obtain a first value of a first significant bit of the first storage state; reading the first storage state of the first memory cell to obtain at least one second value of at least one second significant bit of the first storage state; performing a first decoding operation according to the at least one second value to obtain at least one third value of the decoded second significant bit; determining whether the first significant bit is a special bit according to the first storage state and a second storage state corresponding to the at least one third value; and if the first significant bit is the special bit, performing a corresponding decoding operation.

According to the above description, the bit determining method, the memory control circuit unit and the memory storage device of the present invention can be used to determine whether a bit in a data belongs to a special bit (e.g., HRE bit) or not. The memory controller may adjust the decoding parameter corresponding to the special bit to a specific decoding parameter according to the identified special bit and perform a decoding operation again according to the value of the special bit and the specific decoding parameter to try to obtain a codeword after a successful decoding. In the above manner, not only a special bit in a data (for example, a bit belonging to a specific error) can be identified, but also a decoding parameter corresponding to the special bit can be adjusted to a specific decoding parameter, thereby preventing the special bit from affecting the decoding of other bits in the decoding process and improving the probability of success in decoding.

In order to make the aforementioned and other features and advantages of the invention comprehensible, several exemplary embodiments accompanied with figures are described in detail below.

BRIEF DESCRIPTION OF THE DRAWINGS

FIG. 11 is schematic diagrams illustrating a memory cell storage structure and a physical erasing unit according to the present exemplary embodiment.

DESCRIPTION OF EMBODIMENTS

Generally, a memory storage device (which is also referred to as a memory storage system) includes a rewritable non-volatile memory module and a controller (which is also referred to as a control circuit). The memory storage device is generally used together with a host system, such that the host system is adapted to write data into the memory storage device or read data from the memory storage device.

Figure 1:
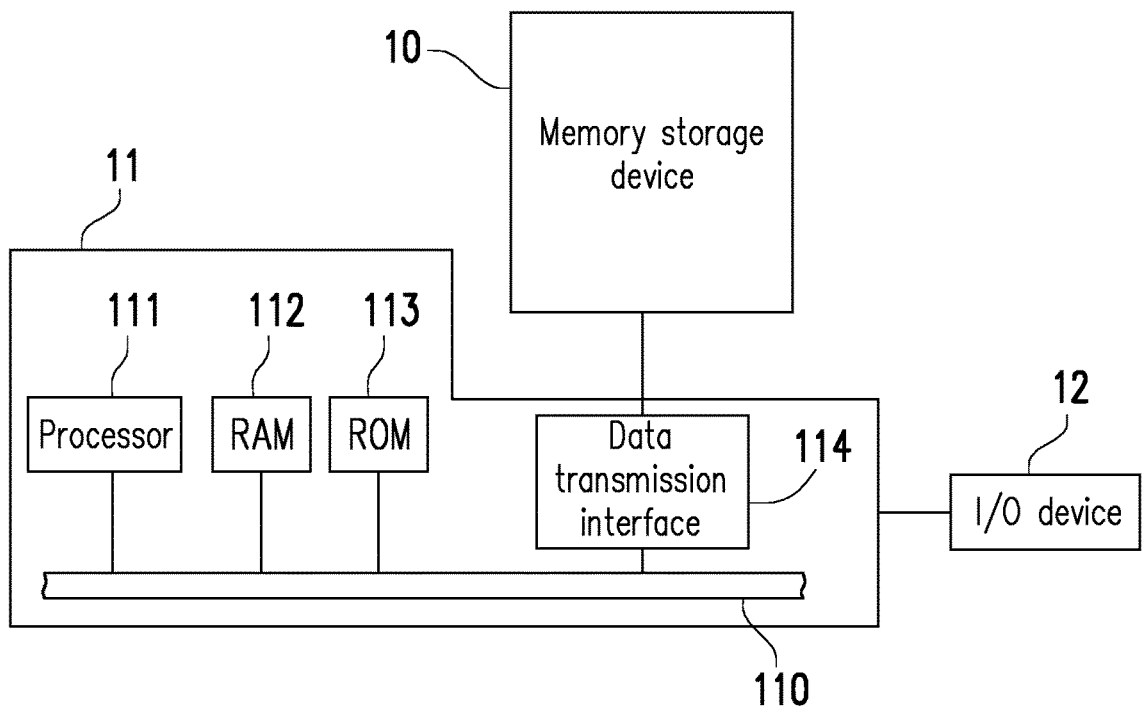
FIG. 1 is a schematic diagram of a host system, a memory storage device and an input/output (I/O) device according to an exemplary embodiment of the invention.
Figure 2:
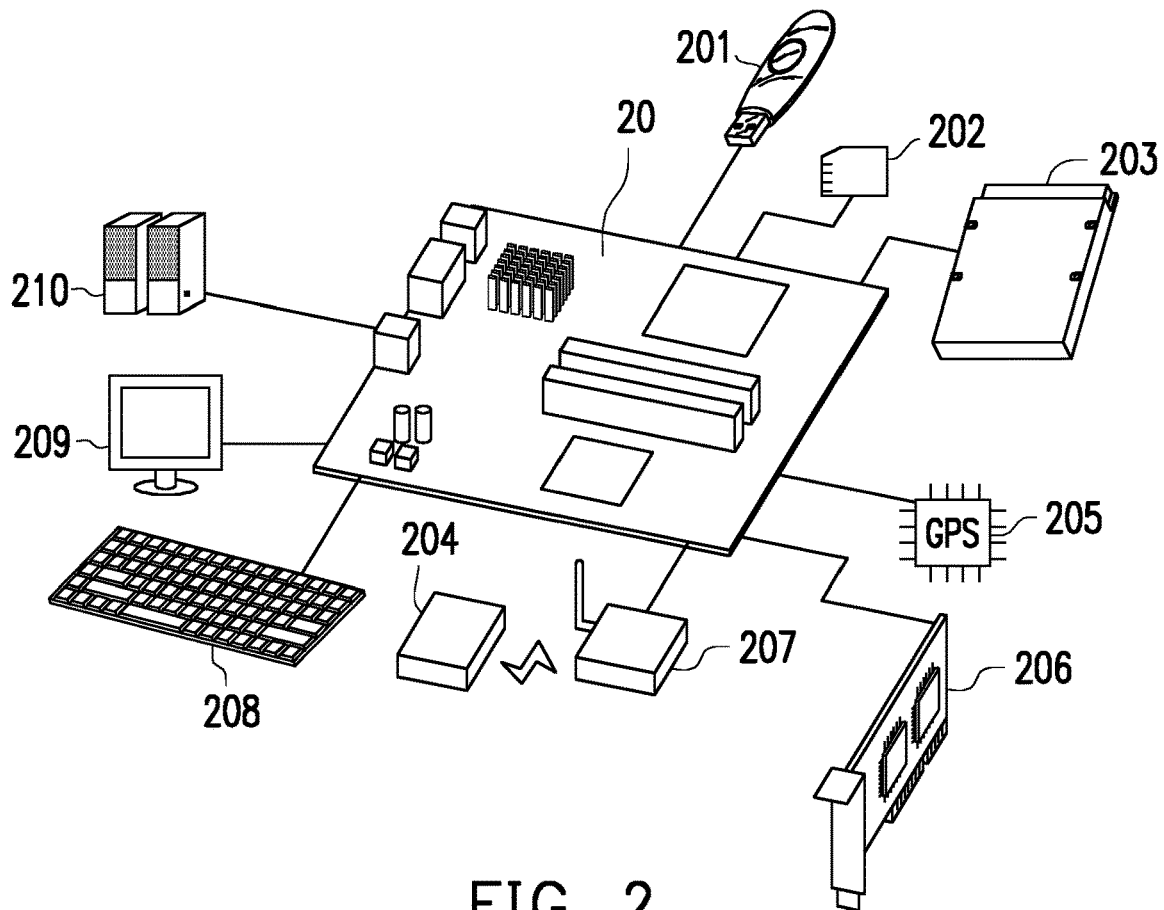
FIG. 2 is a schematic diagram of a host system, a memory storage device and an I/O device according to another exemplary embodiment of the invention.

FIG. 1 is a schematic diagram of a host system, a memory storage device and an input/output (I/O) device according to an exemplary embodiment of the invention. FIG. 2 is a schematic diagram of a host system, a memory storage device and an I/O device according to another exemplary embodiment of the invention.

Referring to FIG. 1 and FIG. 2, the host system 11 generally includes a processor 111, a random access memory (RAM) 112, a read only memory (ROM) 113 and a data transmission interface 114. The processor 111, the RAM 112, the ROM 113 and the data transmission interface 114 are all coupled to a system bus 110.

In the present exemplary embodiment, the host system 11 is coupled to the memory storage device 10 through the data transmission interface 114. For example, the host system 11 may store data into the memory storage device 10 or read data from the memory storage device 10 through the data transmission interface 114. Moreover, the host system 11 is coupled to the I/O device 12 through the system bus 110. For example, the host system 11 may transmit an output signal to the I/O device 12 or receive an input signal from the I/O device 12 through the system bus 110.

In the present exemplary embodiment, the processor 111, the RAM 112, the ROM 113 and the data transmission interface 114 may be disposed on a motherboard 20 of the host system 11. The number of the data transmission interface 114 may be one or plural. The motherboard 20 may be coupled to the memory storage device 10 in a wired or wireless manner. The memory storage device 10 is, for example, a flash drive 201, a memory card 202, a solid state driver (SSD) 203 or a wireless memory storage device 204. The wireless memory storage device 204 is, for example, a memory storage device based on various wireless communication techniques, such as a near field communication (NFC) memory storage device, a wireless fidelity (WiFi) memory storage device, a bluetooth memory storage device or a low power bluetooth memory storage device (for example, iBeacon), etc. Moreover, the motherboard 20 may also be coupled to various I/O devices such as a global positioning system (GPS) module 205, a network interface card 206, a wireless transmission device 207, a keyboard 208, a screen 209, a loudspeaker 210, etc., through the system bus 110. For example, in an exemplary embodiment, the motherboard 20 may access the wireless memory storage device 204 through the wireless transmission device 207.

Figure 3:
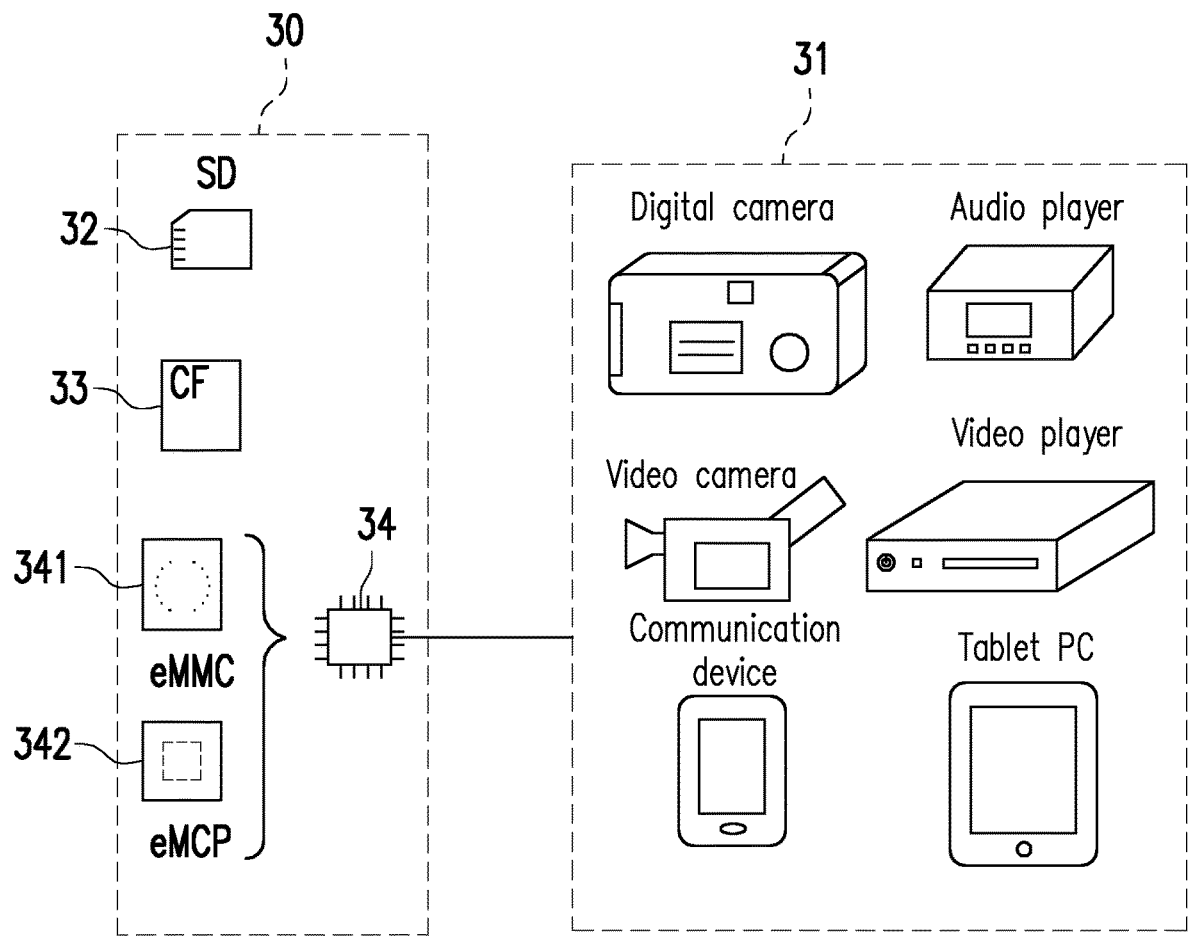
FIG. 3 is a schematic diagram of a host system and a memory storage device according to another exemplary embodiment of the invention.

In an exemplary embodiment, the aforementioned host system may be any system substantially cooperated with the memory storage device to store data. In the aforementioned exemplary embodiment, the host system implemented by a computer system is taken as an example for description; however, FIG. 3 is a schematic diagram of a host system and a memory storage device according to another exemplary embodiment of the invention. Referring to FIG. 3, in another exemplary embodiment, the host system 31 may also be a digital camera, a video camera, a communication device, an audio player, a video player or a tablet PC, etc., and the memory storage device 30 can be a non-volatile memory storage device such as a secure digital (SD) card 32, a compact flash (CF) card 33, or an embedded storage device 34, etc., used by the host system 31. The embedded storage device 34 includes an embedded multimedia card (eMMC) 341 and/or an embedded multi chip package (eMCP) storage device 342, etc., that is formed by directly coupling various memory modules to a substrate of the host system.

Figure 4:
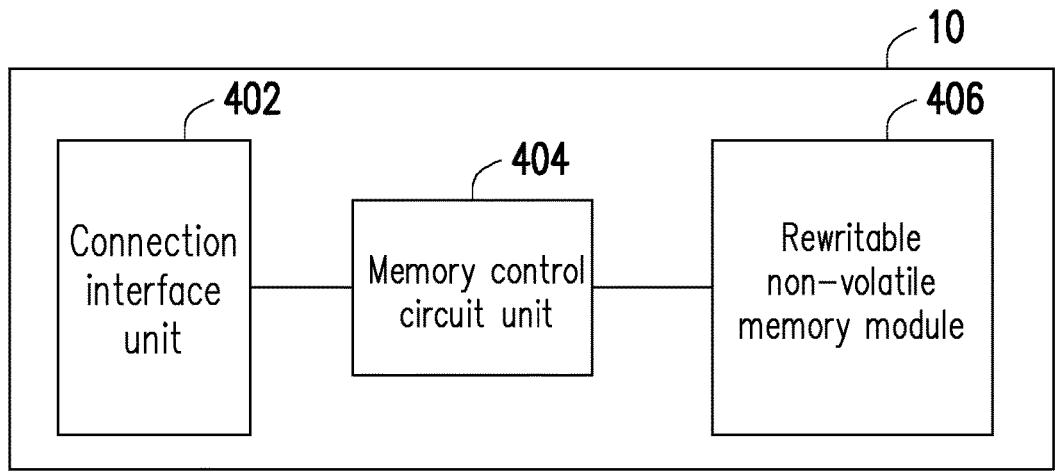
FIG. 4 is a schematic block diagram of a memory storage device according to an exemplary embodiment of the invention.

FIG. 4 is a schematic block diagram of a memory storage device according to an exemplary embodiment of the invention.

Referring to FIG. 4, the memory storage device 10 includes a connection interface unit 402, a memory control circuit unit 404 and a rewritable non-volatile memory module 406.

In the present exemplary embodiment, the connection interface unit 402 is complied with a serial advanced technology attachment (SATA) standard. However, it should be noted that the present invention is not limited thereto, and the connection interface unit 402 may also be complied with a parallel advanced technology attachment (PATA) standard, an institute of electrical and electronic engineers (IEEE) 1394 standard, a peripheral component interconnect (PCI) express standard, a universal serial bus (USB) standard, an SD interface standard, an ultra high speed-I (UHS-I) interface standard, an ultra high speed-II (UHS-II) interface standard, a memory stick (MS) interface standard, a multi-chip package interface standard, a multimedia card (MMC) interface standard, an eMMC interface standard, a universal flash storage (UFS) interface standard, an eMCP interface standard, a CF interface standard, an integrated device electronics (IDE) standard or other suitable standards. The connection interface unit 402 and the memory control circuit unit 404 may be packaged in one chip, or the connection interface unit 402 may be disposed outside a chip containing the memory control circuit unit 404.

The memory control circuit unit 404 may execute a plurality of logic gates or control instructions implemented in a hardware form or a firmware form, and may perform a writing operation, a reading operation or an erasing operation on the rewritable non-volatile memory module 406 according to commands of the host system 11.

The rewritable non-volatile memory module 406 is coupled to the memory control circuit unit 404 for storing data written by the host system 11. The rewritable non-volatile memory module 406 may be a single level cell (SLC) NAND flash memory module (i.e. a flash memory module with one memory cell storing data of one bit), a multi level cell (MLC) NAND flash memory module (i.e. a flash memory module with one memory cell storing data of two bits), a triple level cell (TLC) NAND flash memory module (i.e. a flash memory module with one memory cell storing data of three bits), other flash memory modules or other memory modules having the same characteristic.

The memory cells in the rewritable non-volatile memory module 406 are arranged in an array. The memory cell array arranged in a two-dimensional array is taken as an example for description. However, it should be noted that the following exemplary embodiment is only an example of the memory cell array, and in other exemplary embodiments, configuration of the memory cell array may be adjusted to cope with an actual requirement.

Figure 5:
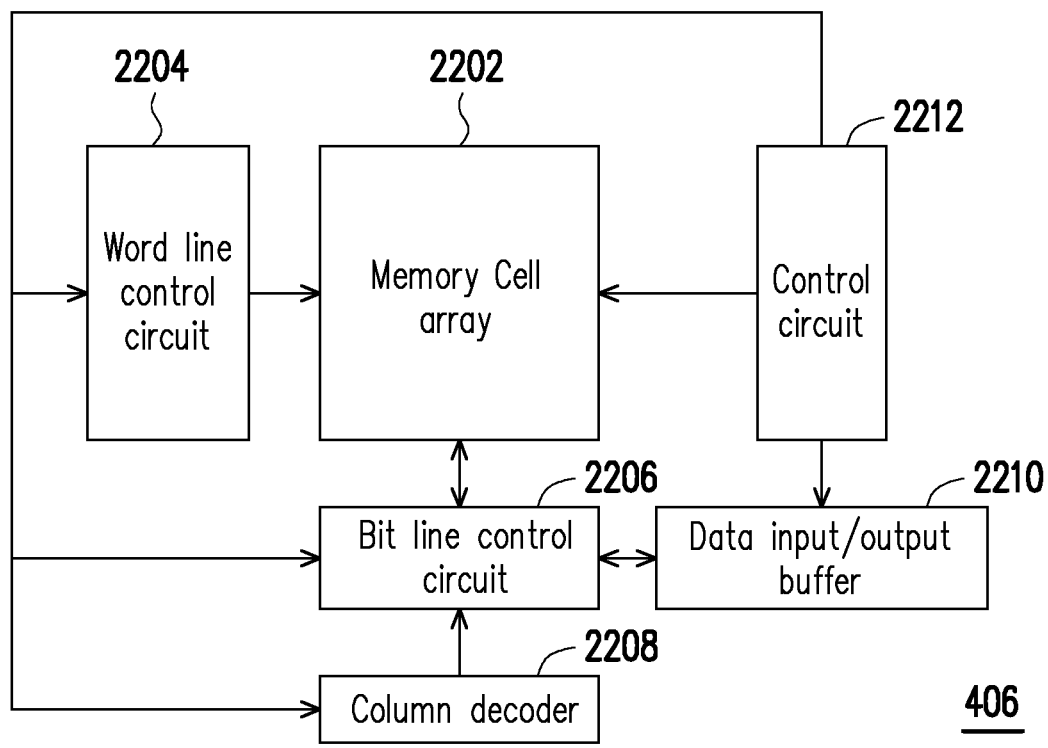
FIG. 5 is a schematic block diagram of a rewritable non-volatile memory module according to an exemplary embodiment of the invention.
Figure 6:
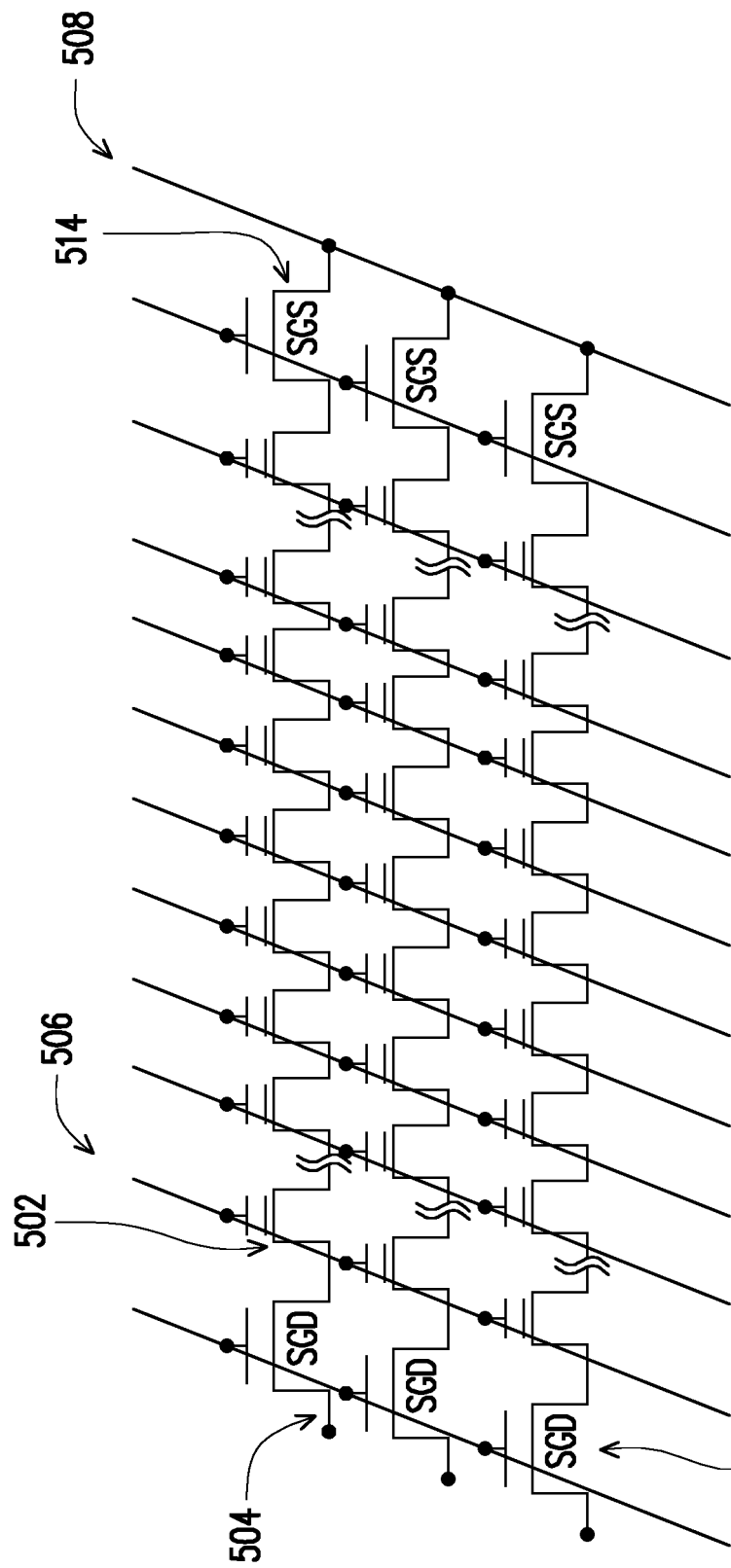
FIG. 6 is a schematic diagram of a memory cell array according to an exemplary embodiment of the invention.

FIG. 5 is a schematic block diagram of a rewritable non-volatile memory module according to an exemplary embodiment of the invention. FIG. 6 is a schematic diagram of a memory cell array according to an exemplary embodiment of the invention.

Referring to FIG. 5 and FIG. 6, the rewritable non-volatile memory module 406 includes a memory cell array 2202, a word line control circuit 2204, a bit line control circuit 2206, a column decoder 2208, a data input/output buffer 2210 and a control circuit 2212.

In the present exemplary embodiment, the memory cell array 2202 may include a plurality of memory cells 502 used for storing data, a plurality of select gate drain (SGD) transistors 512, a plurality of select gate source (SGS) transistors 514, and a plurality of bit lines 504, a plurality of word lines 506 and a common source line 508 connected to the memory cells (as shown in FIG. 6). The memory cells 502 are disposed on intersections of the bit lines 504 and the word lines 506 in an array (or in a 3D stacking manner). If a writing command or a reading command is received from the memory control circuit unit 404, the control circuit 2212 controls the word line control circuit 2204, the bit line control circuit 2206, the column decoder 2208, and the data input/output buffer 2210 to write data into the memory cell array 2202 or read data from the memory cell array 2202, where the word line control circuit 2204 is used for controlling a voltage applied to the word lines 506, the bit line control circuit 2206 is used for controlling a voltage applied to the bit lines 504, the column decoder 2208 selects a corresponding bit line according to a row address in the command, and the data input/output buffer 2210 is used for temporarily storing data.

The memory cells in the rewritable non-volatile memory module 406 store bits through a change of a threshold voltage. To be specific, a control gate and a channel of each of the memory cells have a charge trapping layer therebetween. By applying a writing voltage to the control gate, an amount of electrons of the charge trapping layer may be changed, so as to change the threshold voltage of the memory cell. The procedure of changing the threshold voltage is also referred to as "writing data into the memory cell" or "programming the memory cell". Along with the change of the threshold voltage, each of the memory cells of the memory cell array 2202 has a plurality of storage states, and the storage state of the memory cell may be determined through a reading voltage, so as to obtain the bits stored in the memory cell.

Figure 7:
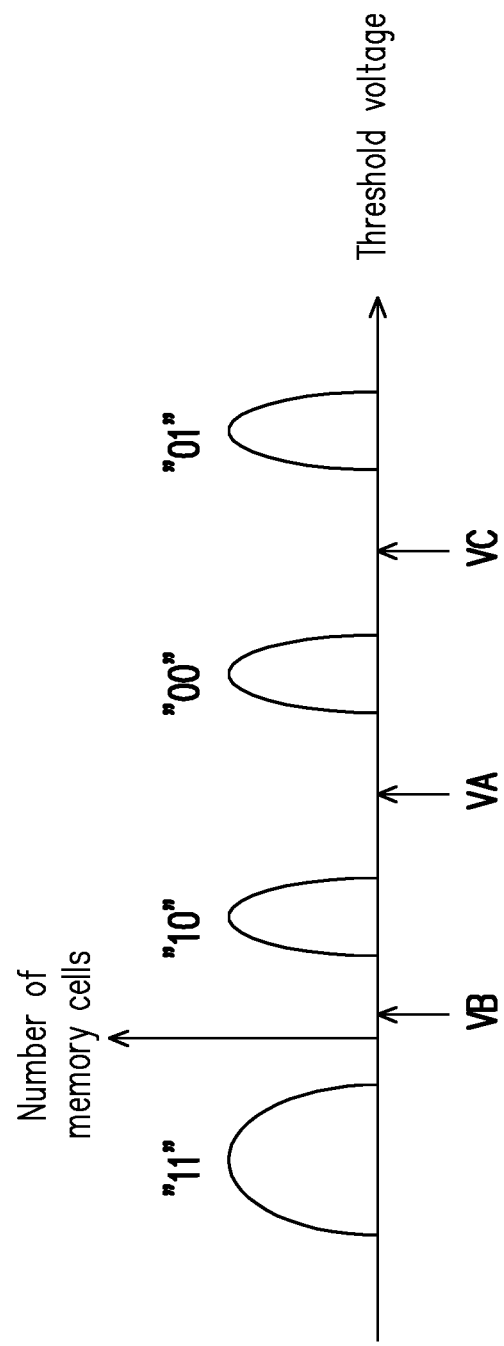
FIG. 7 is a statistical distribution diagram of gate voltages corresponding to writing data stored in the memory cell array according to an exemplary embodiment of the invention.

FIG. 7 is a statistical distribution diagram of gate voltages corresponding to writing data stored in the memory cell array according to an exemplary embodiment of the invention.

Referring to FIG. 7, an MLC NAND flash memory is take as an example for description, along with different threshold voltages, each of the memory cells have four storage states, and the storages states respectively represent bits of "11", "10", "00" and "01". In other words, each of the storage states includes the least significant bit (LSB) and the most significant bit (MSB). In the present exemplary embodiment, in the storage state (i.e. "11", "10", "00" and "01"), a first bit counted from a left side is the LSB, and a second bit counted from the left side is the MSB. Therefore, in the present exemplary embodiment, each of the memory cells may store two bits. It should be noted that the correspondence between the threshold voltages and the storage states shown in FIG. 7 is only an example. In another exemplary embodiment of the invention, the correspondence between the threshold voltages and the storage states is that the storage states have an arrangement of "11", "10", "01" and "00" or other arrangement along with increase of the threshold voltage. Moreover, in another exemplary embodiment of the invention, it is defined that the first bit counted from the left side is the MSB, and the second bit counted from the left side is the LSB.

Figure 8:
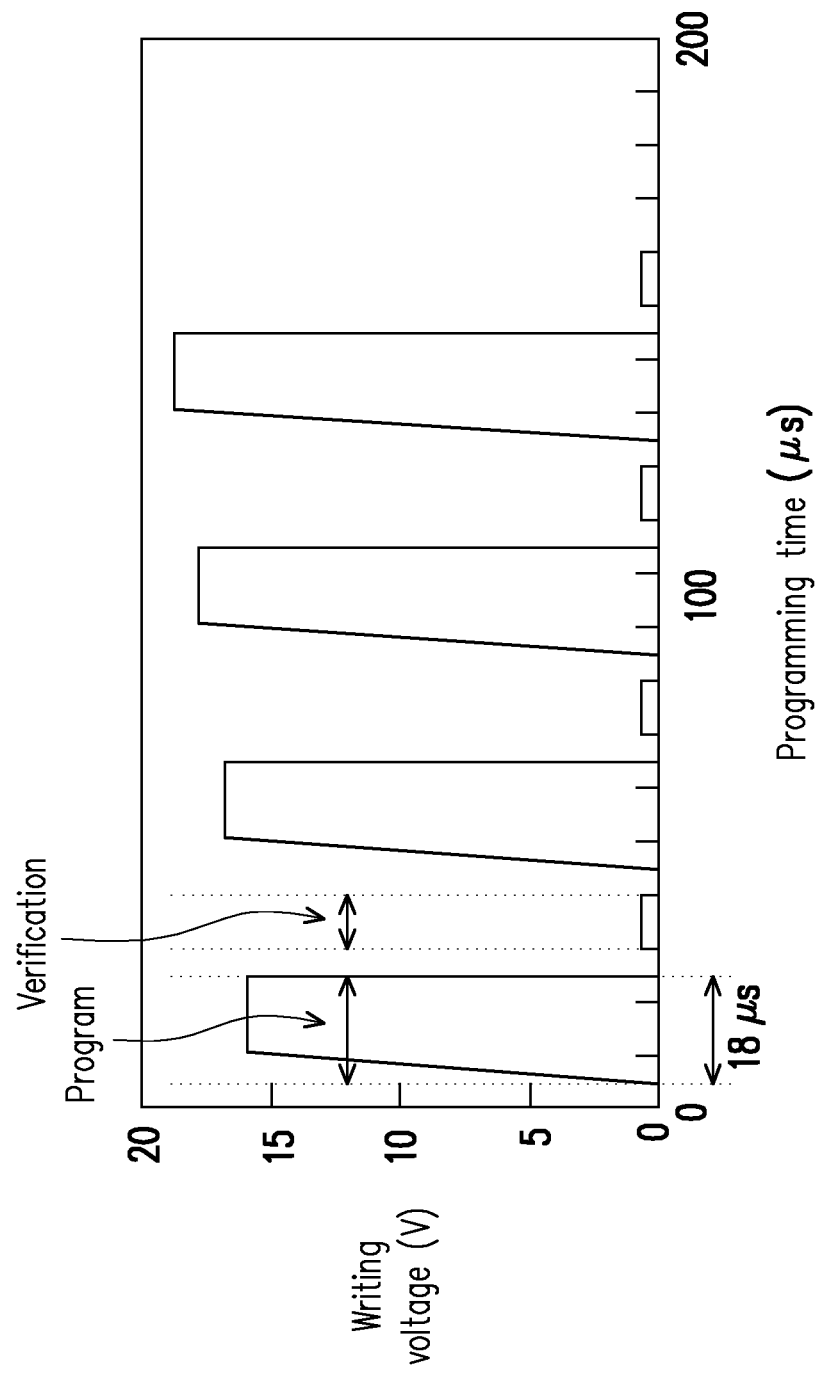
FIG. 8 is a schematic diagram of programming a memory cell according to an exemplary embodiment of the invention.

FIG. 8 is a schematic diagram of programming a memory cell according to an exemplary embodiment of the invention.

Referring to FIG. 8, in the present exemplary embodiment, programming of the memory cells is implemented through a method of pulse writing/verifying threshold voltage. To be specific, if data is to be written into a memory cell, the memory control circuit unit 404 sets an initial writing voltage and a writing pulse time, and instructs the control circuit 2212 of the rewritable non-volatile memory module 406 to program the memory cell by using the initial writing voltage and the writing pulse time, so as to implement the data writing operation. Then, the memory control circuit unit 404 applies a verification voltage to the control gate to determine whether the memory cell is conducted, so as to determine whether the memory cell is in a correct storage state (having a correct threshold voltage). If the memory cell is not programmed to the correct storage state, the memory control circuit unit 404 instructs the control circuit 2212 to add an incremental-step-pulse programming (ISPP) adjusting value to the current applied writing voltage to serve as a new writing voltage, and again programs the memory cell according to the new writing voltage and the writing pulse time. Conversely, if the memory cell has been programmed to the correct storage state, it represents that the data is correctly written into the memory cell. For example, the initial writing voltage is set to 16 volts (V), the writing pulse time is set to 18 microseconds (μs) and the ISPP adjusting value is set to 0.6V, though the invention is not limited thereto.

Figure 9:
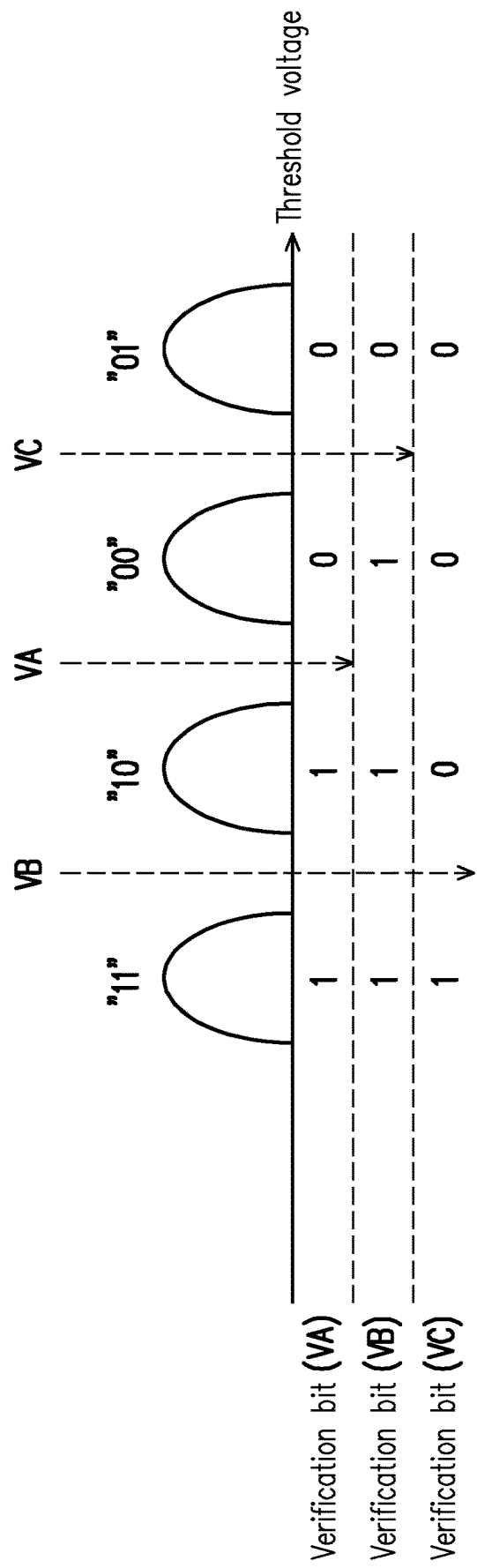
FIG. 9 is a schematic diagram of reading data from the memory cell according to an exemplary embodiment of the invention, where the MLC NAND flash memory is taken as an example for description.

FIG. 9 is a schematic diagram of reading data from the memory cell according to an exemplary embodiment of the invention, where the MLC NAND flash memory is taken as an example for description.

Referring to FIG. 9, a reading operation of the memory cell of the memory cell array 2202 is implemented by applying a reading voltage to the control gate, and identifying the data stored in the memory cell through a conduction state of the memory cell. A verification bit (VA) is used for instructing whether the memory cell is conducted if a reading voltage VA is applied; a verification bit (VC) is used for instructing whether the memory cell is conducted if a reading voltage VC is applied; and a verification bit (VB) is used for instructing whether the memory cell is conducted if a reading voltage VB is applied. It is assumed that the corresponding memory cell is conducted if the verification bit is "1", and the corresponding memory cell is not conducted if the verification bit is "0". As shown in FIG. 9, through the verification bits (VA)-(VC), the storage state of the memory cell is determined, so as to obtain the stored bit.

Figure 10:
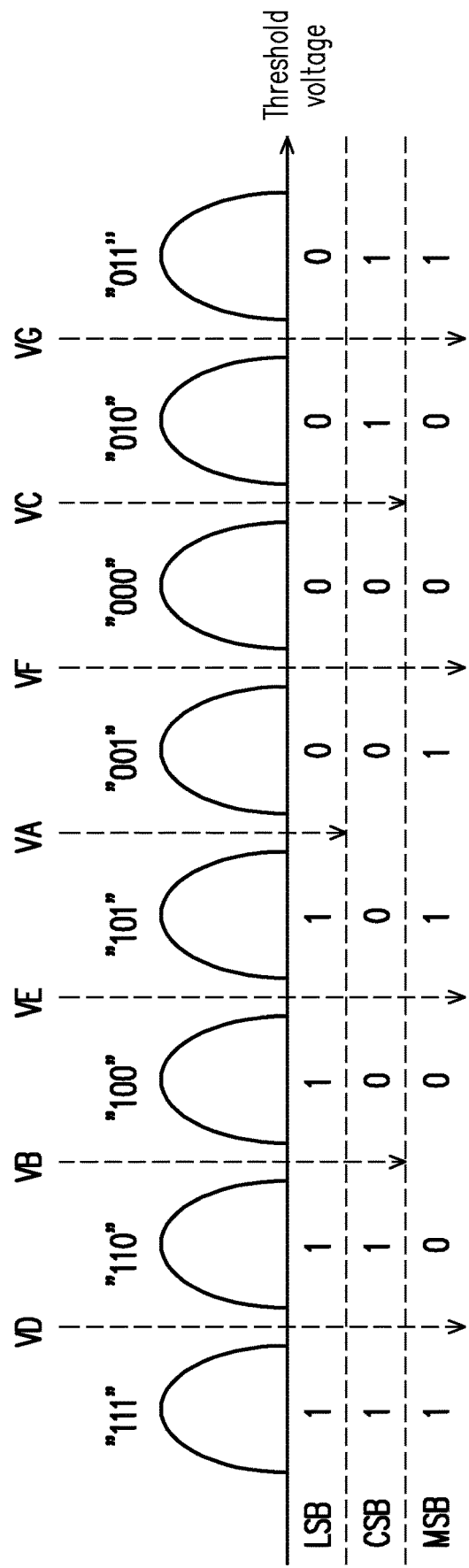
FIG. 10 is a schematic diagram of reading data from the memory cell according to another exemplary embodiment of the invention.

FIG. 10 is a schematic diagram of reading data from the memory cell according to another exemplary embodiment of the invention.

Referring to FIG. 10, a TLC NAND flash memory is taken as an example for description, each of the storages states includes the LSB of the first bit counted from the left side, a center significant bit (CSB) of the second bit counted from the left side and the MSB of a third bit counted from the left side. In the present exemplary embodiment, according to different threshold voltages, the memory cell has 8 storage states (i.e. "111", "110", "100", "101", "001", "000", "010" and "011"). By applying the reading voltages VA-VG to the control gate, the bits stored in the memory cell may be identified.

It should be noted that, taking the MLC NAND flash memory as an example, a plurality of memory cells arranged on the same word line can constitute two physical programming units. Herein, the physical programming units constituted by the LSBs of said memory cells are known as a lower physical programming unit, and the physical programming units constituted by the MSBs of said memory cells are known as an upper physical programming unit. Taking the TLC NAND flash memory as an example, a plurality of memory cells arranged on the same word line can constitute three physical programming units. Herein, the physical programming units constituted by the LSBs of said memory cells are known as a lower physical programming unit, the physical programming units constituted by the CSBs of said memory cells are known as a center physical programming unit, and the physical programming units constituted by the MSBs of said memory cells are known as an upper physical programming unit.

FIG. 11 is schematic diagrams illustrating a memory cell storage structure and a physical erasing unit according to the present exemplary embodiment.

Referring to FIG. 11, taking the TLC NAND flash memory as an example, one physical erasing unit is constituted by a plurality of physical programming unit groups. Each of the physical programming unit groups includes the lower physical programming unit, the center physical programming unit and the upper physical programming unit constituted by multiple memory cells arranged on the same word line. For example, in the physical erasing unit, the 0-th physical programming unit belonging to the lower physical programming unit, the 1-st physical programming unit belonging to the center physical erasing unit and the 2-nd physical programming unit belonging to the upper physical programming unit are regarded as one physical programming unit group. Similarly, the 3-rd, the 4-th, and the 5-th physical programming units are regarded as one physical programming unit group, and by analogy, the other physical programming units are also grouped into multiple physical programming unit groups by the same method. In other words, in the exemplary embodiment of FIG. 11, the physical erasing unit includes 258 physical programming units in total, and the lower physical programming unit, the center physical programming unit and the upper physical programming unit constituted by multiple memory cells arranged on the same word line can constitute one physical programming unit group. Therefore, the physical erasing unit of FIG. 11 may be divided into 86 physical programming unit groups in total. However, it should be noted that, the invention is not intended to limit the numbers of the physical programming unit or the physical programming unit groups in the physical erasing unit.

Figure 12:
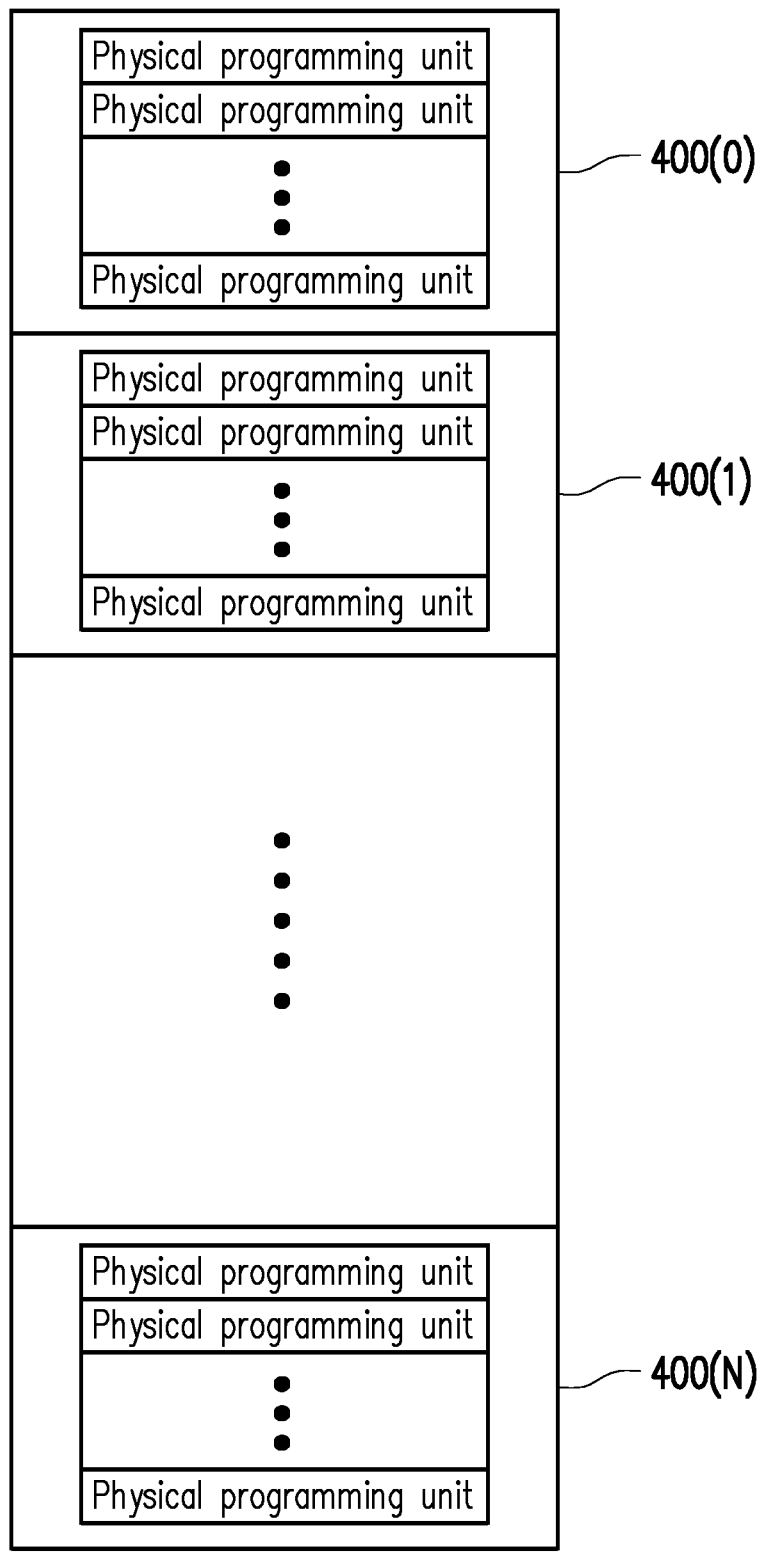
FIG. 12 is a schematic diagram of a rewritable non-volatile memory module according to an exemplary embodiment of the invention.

FIG. 12 is a schematic diagram of a rewritable non-volatile memory module according to an exemplary embodiment of the invention.

Referring to FIG. 12, memory cells 502 of the rewritable non-volatile memory module 406 may construct a plurality of physical programming units, and the physical programming units may construct a plurality of physical erasing units 400(0)-400(N). To be specific, the memory cells on a same word line consist one or a plurality of physical programming units. If one memory cell stores two or more bits, the physical programming units on the same word line may be categorized into a lower physical programming unit and an upper physical programming unit. For example, the LSB of each memory cell belongs to the lower physical programming unit, and the MSB of each memory cell belongs to the upper physical programming unit. In the present exemplary embodiment, physical programming unit is the smallest unit for programming data. Namely, physical programming unit is the smallest unit for writing data. For example, the physical programming unit is a physical page or a physical sector. If the physical programming unit is the physical page, each physical programming unit generally includes a data bit area and a redundant bit area. The data bit area includes a plurality of physical sectors, and is configured to store user data, and the redundant bit area is configured to store system data (for example, error checking and correcting (ECC) codes). In the present exemplary embodiment, each data bit area includes 32 physical sectors, and the size of one physical sector is 512 bytes (B). However, in other exemplary embodiments, the data bit area may also include 8, 16 or more or less physical sectors, and the size and the number of the physical sectors are not limited by the invention. On the other hand, physical erasing unit is the smallest unit for erasing data. Namely, each physical erasing unit contains the least number of memory cells that are erased all together. For example, the physical erasing unit is a physical block.

Figure 13:
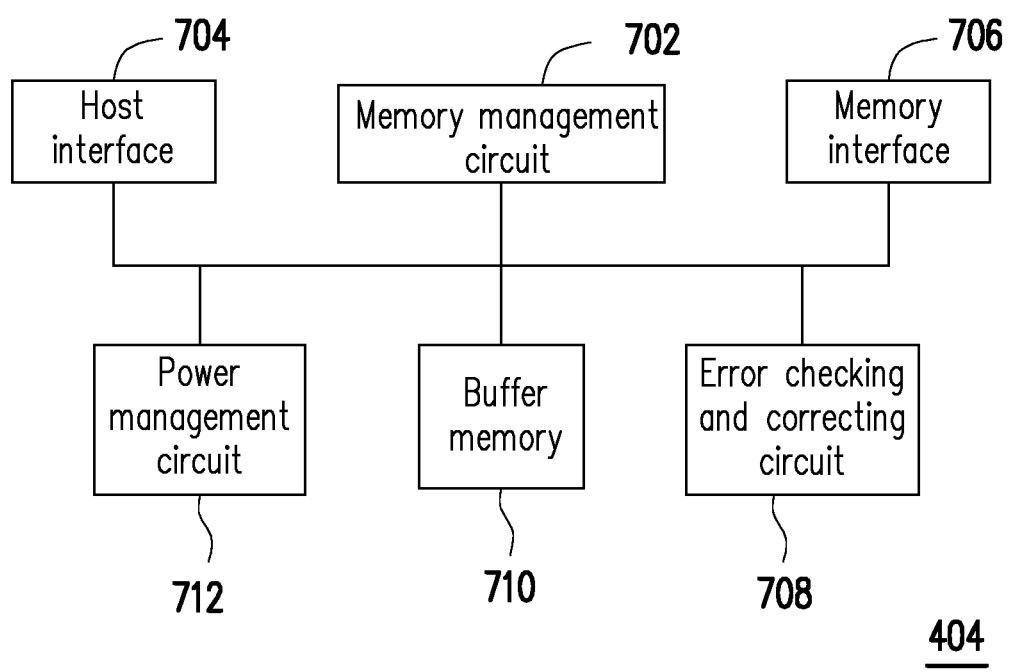
FIG. 13 is a schematic block diagram of a memory control circuit unit according to an exemplary embodiment of the invention.

FIG. 13 is a schematic block diagram of a memory control circuit unit according to an exemplary embodiment of the invention. It should be noted that the structure of the memory control circuit unit in FIG. 13 is only an example, and the invention is not limited thereto.

Referring to FIG. 13, the memory control circuit unit 404 includes a memory management circuit 702, a host interface 704, a memory interface 706 and an error checking and correcting circuit 708.

The memory management circuit 702 is configured to control a whole operation of the memory control circuit unit 404. To be specific, the memory management circuit 702 has a plurality of control instructions, and if the memory storage device 10 operates, these control instructions are executed to implement data writing, reading, erasing operations, etc. Following description of the operations of the memory management circuit 702 or operation of any circuit device included in the memory control circuit unit 404 is equivalent to description of the operations of the memory control circuit unit 404.

In the present exemplary embodiment, the control instructions of the memory management circuit 702 are implemented in a firmware form. For example, the memory management circuit 702 has a micro processing unit (not shown) and a read-only memory (not shown), and these control instructions are burned in the read-only memory. If the memory storage apparatus 10 operates, these control instructions are executed by the micro processing unit to implement the data writing, reading, erasing operations, etc.

In another exemplary embodiment, the control instructions of the memory management circuit 702 may also be stored in a specific area (for example, a system area used for storing system data in the memory module) of the rewritable non-volatile memory module 406 as program codes. Moreover, the memory management circuit 702 has a micro processing unit (not shown), a read-only memory (not shown) and a random access memory (RAM) (not shown). Particularly, the read-only memory has a boot code, and if the memory control circuit unit 404 is enabled, the micro processing unit first runs the boot code to load the control instructions stored in the rewritable non-volatile memory module 406 to the RAM of the memory management circuit 702. Then, the micro processing unit executes these control instructions to implement the data writing, reading, erasing operations, etc.

Moreover, in another exemplary embodiment, the control instructions of the memory management circuit 702 may also be implemented in a hardware form. For example, the memory management circuit 702 includes a micro controller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the micro controller. The memory cell management circuit is used for managing memory cells of the rewritable non-volatile memory module 406 or groups thereof. The memory writing circuit is used for sending a writing command sequence to the rewritable non-volatile memory module 406 to write data into the rewritable non-volatile memory module 406. The memory reading circuit is used for sending a reading command sequence to the rewritable non-volatile memory module 406 to read data from the rewritable non-volatile memory module 406. The memory erasing circuit is used for sending an erasing command sequence to the rewritable non-volatile memory module 406 to erase data in the rewritable non-volatile memory module 406. The data processing circuit is used for processing data to be written into the rewritable non-volatile memory module 406 and data read from the rewritable non-volatile memory module 406. The writing command sequence, the reading command sequence and the erasing command sequence may respectively include one or a plurality of program codes or command codes, and are used for instructing the rewritable non-volatile memory module 406 to execute the corresponding writing, reading, erasing operations, etc. In an exemplary embodiment, the memory management circuit 702 may further send other types of command sequences to the rewritable non-volatile memory module 406 to execute corresponding operations.

The host interface 704 is coupled to the memory management circuit 702, and is configured to receive and recognize commands and data transmitted by the host system 11. Namely, the commands and data transmitted by the host system 11 are transmitted to the memory management circuit 702 through the host interface 704. In the present exemplary embodiment, the host interface 704 is complied with the SATA standard. However, the invention is not limited thereto, and the host interface 704 may also be complied with the PATA standard, the IEEE 1394 standard, the PCI express standard, the USB standard, the SD standard, the UHS-I standard, the UHS-II standard, the MS standard, the MMC standard, the eMMC standard, the UFS standard, the CF standard, the IDE standard or other suitable data transmission standards.

The memory interface 706 is coupled to the memory management circuit 702 and is configured to access the rewritable non-volatile memory module 406. Namely, data to be written into the rewritable non-volatile memory module 406 is converted into a format that may be accepted by the rewritable non-volatile memory module 406 through the memory interface 706. To be specific, if the memory management circuit 702 accesses the rewritable non-volatile memory module 406, the memory interface 706 sends corresponding command sequences. For example, the command sequences may include a writing command sequence indicating to write data, a reading command sequence indicating to read data, an erasing command sequence indicating to erase data, and corresponding command sequences indicating various memory operations (for example, to change a reading voltage level or execute a garbage collection procedure, etc.). These command sequences are, for example, generated by the memory management circuit 702, and are transmitted to the rewritable non-volatile memory module 406 through the memory interface 706. These command sequences may include one or a plurality of signals, or data on the bus. The signals or data may include command codes or program codes. For example, the reading command sequence may include information of an identification code, a memory address, etc. for reading data.

The error checking and correcting circuit 708 is coupled to the memory management circuit 702 and is used for executing an error checking and correcting procedure to ensure correctness of data. To be specific, if the memory management circuit 702 receives a writing command from the host system 11, the error checking and correcting circuit 708 generates an error correcting code (ECC) and/or an error detecting code (EDC) for the data corresponding to the writing command, and the memory management circuit 702 writes the data corresponding to the writing command and the corresponding ECC and/or the EDC to the rewritable non-volatile memory module 406. Then, if the memory management circuit 702 reads data from the rewritable non-volatile memory module 406, the ECC and/or the EDC corresponding to the data are simultaneously read, and the error checking and correcting circuit 708 performs the error checking and correcting procedure on the read data according to the ECC and/or the EDC.

In an exemplary embodiment of the invention, the memory control circuit unit 404 further includes a buffer memory 710 and a power management circuit 712. The buffer memory 710 is coupled to the memory management circuit 702 and is used for temporarily storing data and commands coming from the host system 11, or data coming from the rewritable non-volatile memory module 406. The power management circuit 712 is coupled to the memory management circuit 702, and is used for controlling a power of the memory storage device 100.

It is noted that in the following description, some terms may be replaced with corresponding abbreviations for ease of reading (see Table 1).

TABLE 1

| rewritable non-volatile memory module | RNVM module |
|---|---|
| physical programming unit | PPU |
| physical erasing unit | PEU |
| memory management circuit | MMC |

Figure 14:
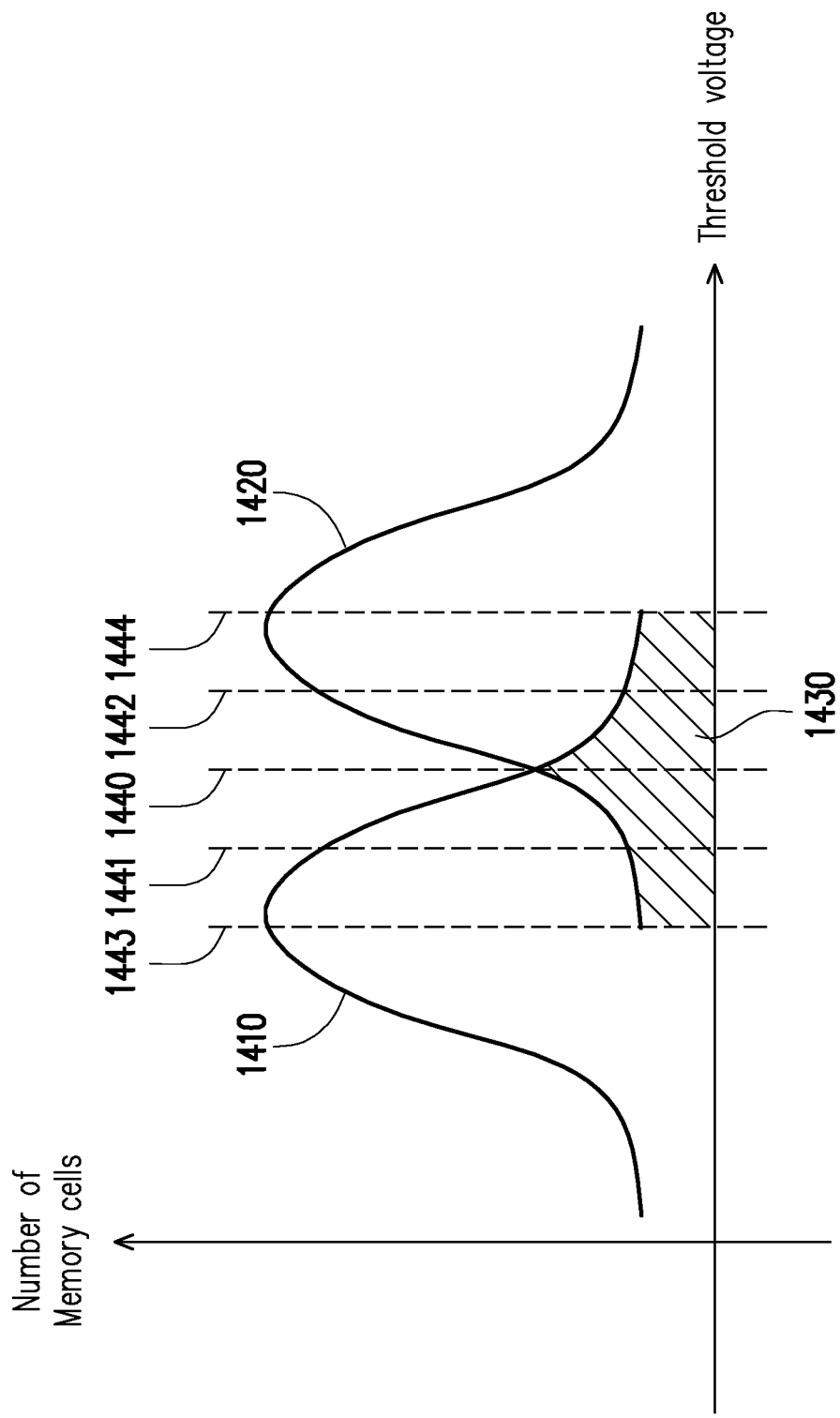
FIG. 14 is a schematic diagram of hard bit mode decoding according to an exemplary embodiment of the invention.

FIG. 14 is a schematic diagram of hard bit mode decoding according to an exemplary embodiment of the invention.

Referring to FIG. 14, an SLC flash memory is taken as an example for description, a distribution 1410 and a distribution 1420 are used for representing storage states of a plurality of first memory cells, and the distribution 1410 and the distribution 1420 respectively represents different storage states. The first memory cells may belong to the same PPU or different PPUs, which is not limited by the invention. It is assumed that if one memory cell belongs to the distribution 1410, the bit stored in the memory cell is "1", and if the memory cell belongs to the distribution 1420, the bit stored in the memory cell is "0". If the MMC 702 reads the memory cell through a reading voltage 1440, the MMC 702 obtains the verification bit, which is used for instructing whether the memory cell is conducted. It is assumed that the verification bit is "1" if the memory cell is conducted, and is "0" otherwise, though the invention is not limited thereto. If the verification bit is "1", the MMC 702 determines that the memory cell belongs to the distribution 1410, and belongs to the distribution 1420 otherwise. However, the distribution 1410 and the distribution 1420 are overlapped in a region 1430. Namely, some memory cells belonging to the distribution 1410 are recognized as belonging to the distribution 1420, and some memory cells belonging to the distribution 1420 are recognized as belonging to the distribution 1410.

In the present exemplary embodiment, if the first memory cells are to be read, the MMC 702 first selects a reading voltage (for example, a reading voltage 1441) to read the first memory cells to obtain a verification bit of the first memory cells. The error checking and correcting circuit 708 executes a decoding operation (which is also referred to as a first decoding operation) containing a probability decoding algorithm according to the verification bit of the first memory cells to generate a plurality of decoding bits, and the decoding bits may construct a codeword.

In the present exemplary embodiment, the probability decoding algorithm is to take a possible decoding result of a symbol as a candidate, and information input during the decoding process or values of an intermediate operation process are indicated by probabilities of the candidates or a ratio of probabilities between the candidates, so as to determine the most possible candidate. For example, if one symbol has two candidates (bit 0 and bit 1), the probability decoding algorithm is to calculate the most possible candidate according to occurrence probabilities of 0 or 1, or calculate the most possible candidate according to a ratio of probabilities between 0 and 1. It is assumed that there are N candidates, for example, the possible values are 0~N−1 (N is a positive integer, and each candidate represents multiple bits) under a finite field, the probability decoding algorithm is to respectively calculate the probabilities of the N candidate to determine the most possible candidate, or take the probability of one of the values as a denominator to calculate a relative probability ratio to determine the most possible candidate. In an exemplary embodiment, the aforementioned probability ratio may be represented in form of logarithm.

In the present exemplary embodiment, the probability decoding algorithm may also be a convolutional code, a turbo code, a low-density parity-check code or other algorithms with probability decoding features. For example, in the convolutional code and the turbo code, a finite state machine may be applied for encoding and decoding, and in the present exemplary embodiment, the most possible states may be calculated according to the verification bits, so as to generate the decoding bits. The low-density parity-check code is taken as an example for description.

If the low-density parity-check code is applied, if a first decoding operation is executed according to the verification bits, the MMC 702 obtains a decoding initial value of each memory cell according to each of the verification bits. For example, if the verification bit is "1", the MMC 702 sets the decoding initial value of the corresponding memory cell to n; and if the verification bit is "0", the decoding initial value is −n, where n is a positive integer, though the invention does not limit the value of the positive integer n, and in an embodiment, n is, for example, 8.

Then, the error checking and correcting circuit 708 executes iterative decoding of the low-density parity-check algorithm according to the decoding initial values to generate a codeword including a plurality of decoding bits. In the iterative decoding, the decoding initial values are continuously updated to represent a probability, and the probability is also referred to as a reliability or a belief. The updated decoding initial values may be converted into a plurality of decoding bits, and the error checking and correcting circuit 708 may take the decoding bits as a vector, and multiply the vector with a module 2 matrix of a parity-check matrix of the low-density parity-check algorithm, so as to obtain a plurality of syndromes. The syndromes may be used for determining whether the codeword composed of the decoding bits is a valid codeword. If the codeword composed of the decoding bits is the valid codeword, the iterative decoding is stopped, and the error checking and correcting circuit 708 outputs the codeword composed of the decoding bits. If the codeword composed of the decoding bits is an invalid codeword, the decoding initial values are continually updated to generate new decoding bits to perform a next iteration. If the number of iterations reaches a predetermined iteration times, the iterative decoding is stopped. The error checking and correcting circuit 708 determines whether the decoding is successful by using the decoding bits generated by the last iteration. For example, if it is determined that the decoding bits generated by the last iteration constitute the valid codeword according to the syndromes, the decoding is successful; and if the first decoding bits constitute the invalid codeword, it represents that the decoding is failed.

In another exemplary embodiment, the probability decoding algorithm included in the decoding operation is the convolutional code and the turbo code, and the decoding operation further includes other error correcting codes. For example, the convolutional code and the turbo code may be used in collaboration with a parity code of any algorithm. In the decoding operation, after execution of the decoding part of the convolutional code or the turbo code is completed, the parity code may be used for determining whether the codeword composed of the generated decoding bits is the valid codeword, so as to determine whether the decoding is successful.

Regardless of the type of the used error correcting code, if the decoding is failed, it represents that the first memory cells store uncorrectable error bits. If the decoding is failed, the MMC 702 obtains another reading voltage, and uses the another reading voltage (for example, a reading voltage 1442) to read the first memory cells, so as to re-obtain the verification bits of the memory cells. The MMC 702 may execute the aforementioned first decoding operation according to the re-obtained verification bits to obtain another codeword composed of a plurality of decoding bits. In an exemplary embodiment, the error checking and correcting circuit 708 determines whether the another codeword is a valid codeword according to the syndromes corresponding to the another codeword. If the another codeword is not the valid codeword, the MMC 702 determines that the decoding is failed. If the number of times for re-obtaining the reading voltage is not greater than a predetermined number of times, the MMC 702 re-obtains the other reading voltage (for example, a reading voltage 1443), and reads the first memory cells according to the re-obtained reading voltage 1443, so as to re-obtain the verification bits and execute the first decoding operation.

In other words, if there are the uncorrectable error bits, by re-obtaining the reading voltage, the verification bits of some of the memory cells are changed, so as to change some probabilities in the probability decoding algorithm, and it accordingly has a chance to change the decoding result of the decoding operation. Logically, the operation of re-obtaining the reading voltage is required to flip some bits in one codeword, and re-decode the new codeword. In some cases, the codeword that cannot be decoded before the flip (there are the uncorrectable error bits) has a chance of being decoded after the flip. Moreover, in an exemplary embodiment, the MMC 702 may attempt the decoding for several times, until the number of attempts exceeds a predetermined number of times. However, the predetermine number of times is not limited by the invention.

It should be noted that in FIG. 14, the SLC flash memory is taken as an example for description, however, the step of re-obtaining the reading voltage is also adapted to the MLC or TLC flash memory. As shown in FIG. 9, to change the reading voltage VA may flip the LSB of one memory cell, and to change the reading voltage VB or VC may flip the MSB of one memory cell. Therefore, to change the reading voltage VA, VB or VC may all change one codeword into another codeword. The result of changing the codeword is also adapted to the TLC flash memory of FIG. 10. The invention does not limit the use of the SLC, MLC or TLC flash memory.

In the exemplary embodiment of FIG. 14, the decoding initial values of the memory cells are divided into two values (for example, n and −n) according to one verification bit. The iterative decoding executed according to the two values is also referred to as a hard bit mode iterative decoding. However, the step of changing the reading voltage may also be applied to a soft bit mode iterative decoding, where the decoding initial values of each memory cell are determined according to a plurality of verification bits. It should be noted that regardless of the hard bit mode or the soft bit mode, the probabilities of the bits are calculated in the iterative decoding, so that the hard bit mode or the soft bit mode all belong to the probability decoding algorithm.

Figure 15:
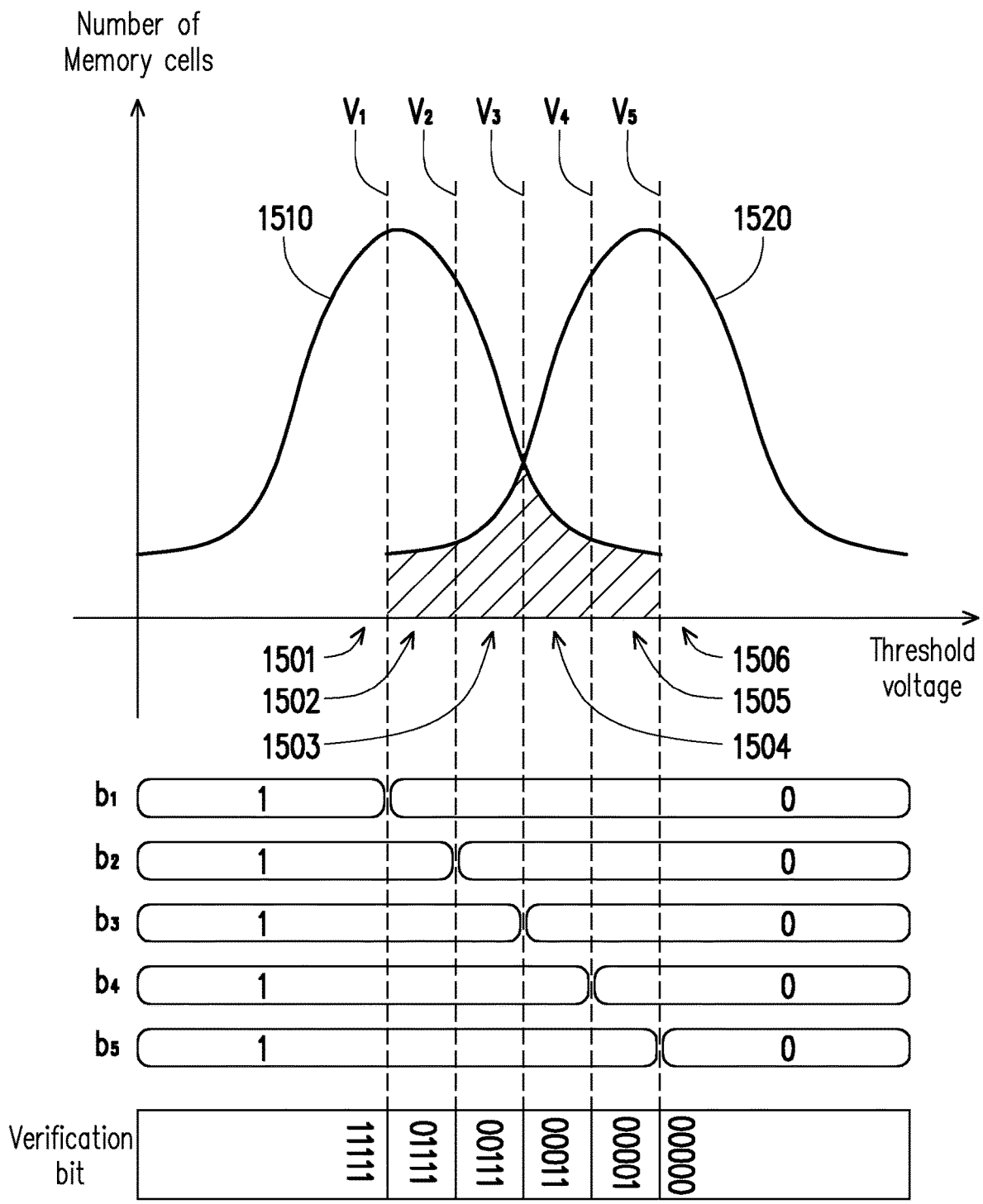
FIG. 15 is a schematic diagram of soft bit mode decoding according to an exemplary embodiment of the invention.

FIG. 15 is a schematic diagram of soft bit mode decoding according to an exemplary embodiment of the invention.

As describe above, after the reading voltage is applied to the control gate of the memory cell, based on whether the memory cell is conducted, the verification bit obtained by the MMC 702 is "0" or "1". It is assumed that the corresponding verification bit is "0" if the memory cell is not conducted, and is "1" otherwise. In FIG. 14, the MMC 702 applies reading voltages $V_1$-$V_5$ to the memory cell to obtain 5 verification bits. To be specific, the reading voltage $V_1$ corresponds to a verification bit $b_1$; the reading voltage $V_2$ corresponds to a verification bit $b_2$; the reading voltage $V_3$ corresponds to a verification bit $b_3$; the reading voltage $V_4$ corresponds to a verification bit $b_4$; and the reading voltage $V_5$ corresponds to a verification bit $b_5$. If the threshold voltage of one memory cell is in a section 1501, from the verification bit $b_1$ to the verification bit $b_5$, the verification bits obtained by the MMC 702 are "11111"; if the threshold voltage of the memory cell is in a section 1502, the verification bits are "01111"; if the threshold voltage of the memory cell is in a section 1503, the verification bits are "00111"; if the threshold voltage of the memory cell is in a section 1504, the verification bits are "00011"; if the threshold voltage of the memory cell is in a section 1505, the verification bits are "00001"; and if the threshold voltage of the memory cell is in a section 1506, the verification bits are "00000".

In the present exemplary embodiment, one of the reading voltages $V_1$-$V_5$ is set as a sign reading voltage. The sign reading voltage is used for determining a sign of the decoding initial value. For example, if the reading voltages $V_3$ is the sign reading voltage, the decoding initial values corresponding to the sections 1501-1503 are smaller than 0, and the decoding initial values corresponding to the sections 1504-1506 are greater than 0. Moreover, in each of the sections, a probability that the memory cell belong to the distribution 1510 and a probability of belonging to the distribution 1520 may be calculated in advance. A log likelihood ratio (LLR) is calculated according to the above two probabilities, and the LLR may be used for determining a magnitude of an absolute value of the decoding initial value. Therefore, the MMC 702 obtains the decoding initial values of the memory cell in the soft bit mode according to the sign reading voltage and the verification bits $b_1$-$b_5$. For example, the decoding initial values corresponding to the sections 1501-1503 may be respectively −8, −4 and −3, and the decoding initial values corresponding to the sections 1504-1506 may be respectively 3, 4 and 8. In an exemplary embodiment, the decoding initial values corresponding to each of the sections may be calculated in advance and stored in a look-up table. The MMC 702 may input the verification bits $b_1$-$b_5$ to the lookup table to obtain the corresponding decoding initial value. In other words, in an actual implementation, the MMC 702 may obtain the decoding initial values of the memory cell in the soft bit mode according to the verification bits $b_1$-$b_5$ without referring to the sign reading voltage. Moreover, if different sign reading voltages are set, the MMC 702 may use different lookup table.

After the MMC 702 obtains the decoding initial values, the error checking and correcting circuit 708 executes the iterative decoding to the decoding initial values to obtain the codeword composed of a plurality of decoding bits, and determine whether the decoding is successful by using the codeword composed of the decoding bits. If the decoding is failed, the MMC 702 re-obtains another reading voltage.

After the other reading voltage is re-obtained, the LLR corresponding to each of the sections is also changed, so that the MMC 702 may use a different lookup table to obtain the decoding initial values. Logically, to change the reading voltage is intended to flip some bits in one codeword, and give different decoding initial values (to change a magnitude or a sign of a value), such that the codeword (having uncorrectable error bits) that cannot be decoded before the change has a chance of being decoded after the change.

In the exemplary embodiment of FIG. 15, one decoding initial value of the soft bit mode decoding (also referred to as a soft bit decoding operation) is determined by 5 verification bits (reading voltages). However, in other exemplary embodiments, one decoding initial value of the soft bit mode decoding may also be determined by more or less verification bits, which is not limited by the invention.

However, it should be noted that, generally, if a decoding operation using the soft bit mode is performed by using the HRE bit, it causes that the error floor region of the bit error rate and the decoding converging speed of the decoder decrease and it may cause decoding to fail. Therefore, the bit determining method proposed by the present invention can find (or determine) the HRE bit in a codeword if fails occurred in decoding the codeword and adjust the LLR corresponding to the HRE bit (also referred to as a decoding parameter) to a specific value and re-decoding the codeword according to the decoding initial value corresponding to the adjusted LLR to try to obtain a successfully decoded codeword. In particular, adjusting the LLR corresponding to the HRE bit to a specific value can prevent the HRE bit from affecting the decoding of other bits during the decoding process, thereby improving the probability of success in decoding. It should be noted that although the present application is described by taking an example of finding a special bit in a codeword (for example, the aforementioned HRE bit), the present invention is not used to limit the type of error occurrence of a special bit. In other embodiments, the aforementioned special bits may also be errors generated by other non-HREs.

The following is an explanation of an embodiment in which the HRE bit in the codeword is found.

Figures 16, 17:
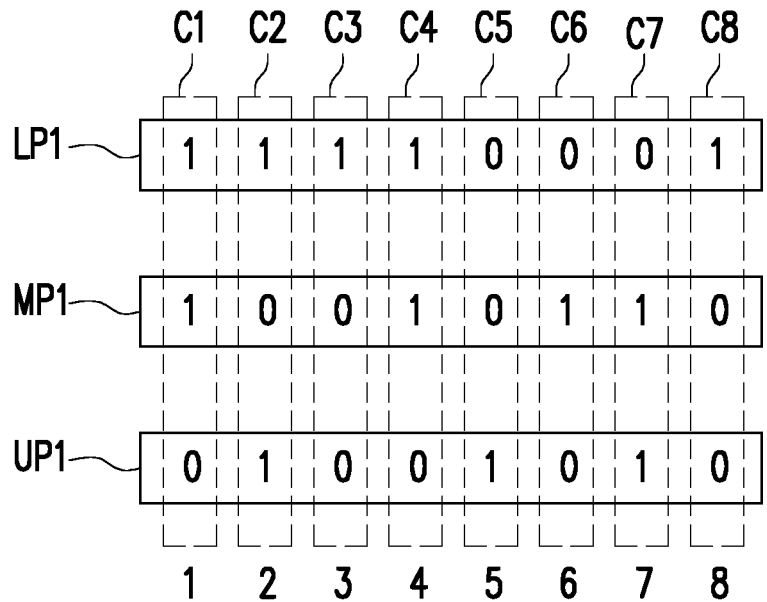
FIG. 16 is a schematic diagram illustrating an example of performing the bit determining method according to an exemplary embodiment of the invention.
FIG. 17 is a schematic diagram illustrating the value of the decoded second significant bit according to an exemplary embodiment of the invention.

FIG. 16 is a schematic diagram illustrating an example of performing the bit determining method according to an exemplary embodiment of the invention.

Referring to FIG. 16, it is assumed that the RNVM module 406 has a PPU group G1. The PPU group G1 has a lower PPU LP1, a center PPU MP1, and an upper PPU UP1. The PPU group G1 is constituted by memory cells C1~C8 located on the same word line. The LSBs of the memory cells C1~C8 can form the lower PPU LP1, the CSBs of the memory cells C1~C8 can form the center PPU MP1, and the MSBs of the memory cells C1~C8 can form the upper PPU UP1.

It is assumed that the MMC 702 reads the data of the center PPU MP1 and the MMC 702 (or the error check and correction circuit 708) performs a soft bit decoding operation (herein referred to as a second decoding operation) according to the data. If a failure occurs during the MMC 702 performing the second decoding operation according to the data of the center PPU MP1, the bit determining method of the present invention may be performed to determine whether the HRE bit is included in the data of the center PPU MP1.

For example, as shown in FIG. 16, in the process of determining whether the HRE bit is included in the data of the center PPU MP1, the data of other PPUs in the PPU group G1 to which the center PPU MP1 (also referred to as a first PPU) belongs is first read out. That is to say, the MMC 702 needs to read the data of the lower PPU LP1 and the upper PPU UP1.

Here, it takes determining whether the first bit of the center PPU MP1 is the HRE bit or not as an example. The value of the first bit of the center PPU MP1 is the value (herein referred to as a first value) of the CSB (herein referred to as a first significant bit) of the memory cell C1 (herein referred to as a first memory cell), and the first value is "1". The first value may be read before the second decoding operation or in the process of determining whether the first bit of the center PPU MP1 is the HRE bit, and is not limited herein. In the bit determining method of the present invention, the MMC 702 reads the lower PPU LP1 to obtain the first bit of the lower PPU LP1, and the value of the first bit of the lower PPU LP1 is the value of the LSB of the memory cell C1. Similarly, the MMC 702 reads the upper PPU UP1 to obtain the first bit of the upper PPU UP1, and the value of the first bit of the upper PPU UP1 is the value of the MSB of the memory cell C1. Therein, the LSB and the MSB of the memory cell C1 may be collectively referred to as "second significant bits", and the value of the second significant bits may be collectively referred to as "second values."

In other words, from the viewpoint of the memory cell C1, the values of the "first significant bit" and "second significant bits" represent the current storage state (also referred to as a first storage state) of the memory cell. In the example of FIG. 16, the current storage state of the memory cell C1 is "110".

After obtaining the second values, the MMC 702 performs the soft bit decoding operation (herein referred to as a first decoding operation) according to the second values to obtain values (herein referred to as a third values) of the decoded second significant bit, and determines whether the first significant bit is the HRE bit (also referred to as a special bit) or not according to the first storage state and the storage state (herein referred to as a second storage state) corresponding to the third values.

In detail, FIG. 17 is a schematic diagram illustrating the value of the decoded second significant bit according to an exemplary embodiment of the invention.

Referring to FIG. 17, continuing the example of FIG. 16, the MMC 702 (or the error checking and correction circuit 708), for example, would respectively perform the soft bit decoding operation (i.e., the first decoding operation described above) on the data stored in the lower PPU LP1 and the upper PPU UP1. Before performing the first decoding operation, as shown by the original value BD1 in FIG. 17, the value of the LSB (i.e., the first bit of the lower PPU LP1) of the memory cell C1 is "1" and the value of the MSB (i.e., the first bit of the upper PPU UP1) of the memory cell C1 is "0". After performing the first decoding operation, the LSB of the memory cell C1 and the MSB of the memory cell C1 may have three decoding results. For example, after the first decoding operation is performed, the value of the LSB of the memory cell C1 is still "1" and the value of the MSB of the memory cell C1 becomes "1" as shown by the decoding result DR1 in FIG. 17. Alternatively, after the first decoding operation is performed, the value of the LSB of the memory cell C1 becomes "0" and the value of the MSB of the memory cell C1 is still "0" as shown by the decoding result DR2 in FIG. 17. Alternatively, after the first decoding operation is performed, the value of the LSB of the memory cell C1 becomes "0" and the value of the MSB of the memory cell C1 becomes "1" as shown by the decoding result DR3 in FIG. 17.

Next, the MMC 702 can determine whether the CSB (i.e., the first bit of the center PPU MP1) of the memory cell C1 is the HRE bit or not according to the storage state (i.e., the second storage state) corresponding to the decoding result DR1, the decoding result DR2, or the decoding result DR3 and the first storage state of the memory cell C1. In particular, if the first storage state and the second storage state are not adjacent to each other in a storage state voltage distribution map (for example, the first storage state and the second storage state are separated by more than one storage state), the MMC 702 can determine that the CSB (i.e., the first bit of the center PPU) of the memory cell C1 is the HRE bit.

Figure 18:
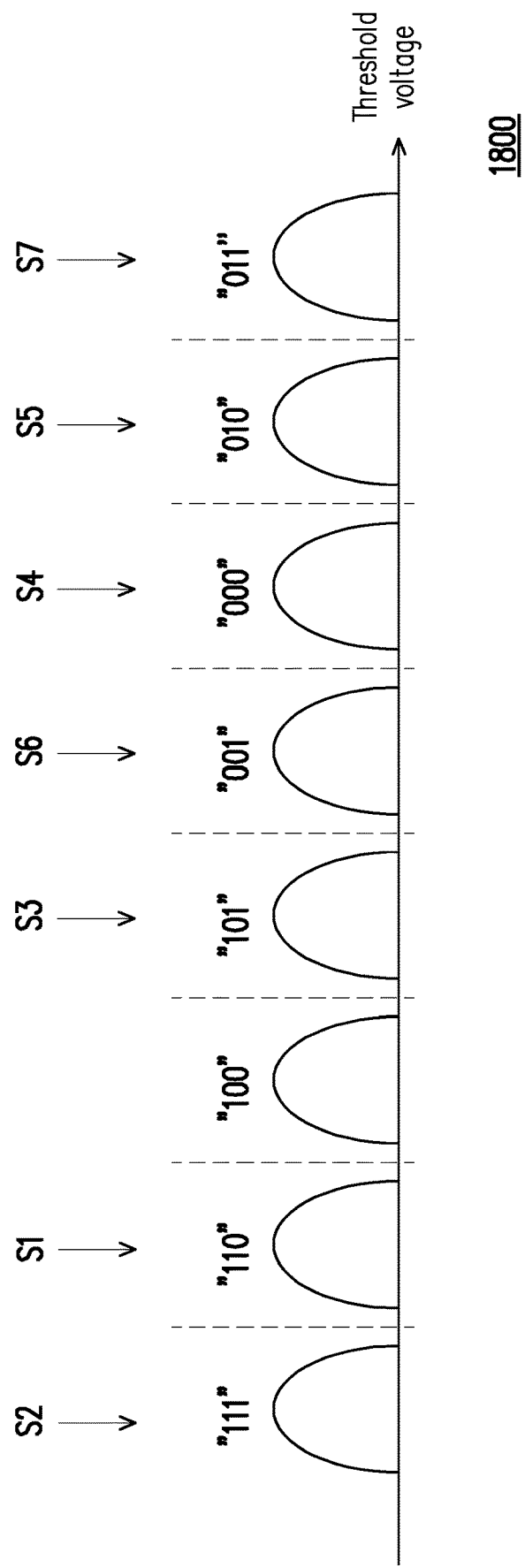
FIG. 18 is a schematic diagram illustrating a storage state voltage distribution map according to an exemplary embodiment of the invention.

In detail, FIG. 18 is a schematic diagram illustrating a storage state voltage distribution map according to an exemplary embodiment of the invention.

Referring to FIG. 18, the storage state voltage distribution map 1800 in FIG. 18 is similar to FIG. 10 in which the memory cell is divided into a plurality of (e.g., eight) storage states according to the threshold voltages. The storage states in the storage state voltage distribution map 1800 is arranged in a sequence. For example, the storage states in the storage state voltage distribution map 1800 is sequentially arranged in the order of "111", "110", "100", "101", "001", "000", "010", and "011". Since the storage state of the memory cell C1 before decoding is "110", the storage state of the memory cell C1 before decoding is located in the interval S1 of the storage state voltage distribution map 1800 of FIG. 18. If the decoding result of the LSB and the MSB of the memory cell C1 is the decoding result DR1 in FIG. 17, in the storage state voltage distribution map 1800 of FIG. 18, the decoding result DR1 corresponds to the intervals S2 and S3. The values of the LSB and MSB of the storage states corresponding to the intervals S2 and S3 are "1" and "1" respectively. It should be noted that since the storage state "111" in the interval S2 is adjacent to the storage state (i.e., "110") of the memory cell C1 before decoding in the storage state voltage distribution map 1800, the MMC 702 cannot confirm whether the error of the CSB of the memory cell C1 is an error belonging to the HRE or not. In this case, the MMC 702 does not identify the CSB (i.e., the first bit of the center PPU MP1) of the memory cell C1 as the HRE bit according to the decoding result DR1.

If the decoding result of the LSB and the MSB of the memory cell C1 is the decoding result DR2 in FIG. 17, the decoding result DR2 corresponds to the intervals S4 and S5 in the storage state voltage distribution map 1800 of FIG. 18. The values of the LSB and MSB of the storage states corresponding to the intervals S4 and S5 are "0" and "0" respectively. Since the storage states of the intervals S4 and S5 are not adjacent to the storage state (i.e., "110") of the memory cell C1 before decoding in the storage state voltage distribution map 1800, the interval S4 is separated from the storage state "110" by at least one storage state or more and the interval S5 is separated from the storage state "110" by at least one storage state or more, the management circuit 702 can determine that the error of the CSB of the memory cell C1 is an error belonging to the HRE and identify the CSB of the memory cell C1 (i.e., the first bit of the center PPU MP1) as the HRE bit according to the decoding result DR2.

If the decoding result of the LSB and the MSB of the memory cell C1 is the decoding result DR3 in FIG. 17, the decoding result DR3 corresponds to the intervals S6 and S7 in the storage state voltage distribution map 1800 of FIG. 18. The values of the LSB and MSB of the storage states corresponding to the intervals S4 and S5 are "0" and "0" respectively. Since the storage states of the intervals S6 and S7 are not adjacent to the storage state (i.e., "110") of the memory cell C1 before decoding in the storage state voltage distribution map 1800, the interval S6 is separated from the storage state "110" by at least one storage state or more and the interval S7 is separated from the storage state "110" by at least one storage state or more, the management circuit 702 can determine that the error of the CSB of the memory cell C1 is an error belonging to the HRE, and identify the CSB of the memory cell C1 (i.e., the first bit of the center PPU MP1) as the HRE bit according to the decoding result DR3.

If a bit is identified as the HRE bit, the MMC 702 (or error checking and correction circuit 708) adjusts the LLR (also referred to as a decoding parameter) corresponding to the bit used in previous decoding to a specific value (also referred to as a specific decoding parameter) and performs a decoding operation (also referred to as a third decoding operation) according to the specific decoding parameter and the value of the bit identified as the HRE bit to obtain a decoded value (also referred to as a fourth value) of the HRE bit.

Figure 19:
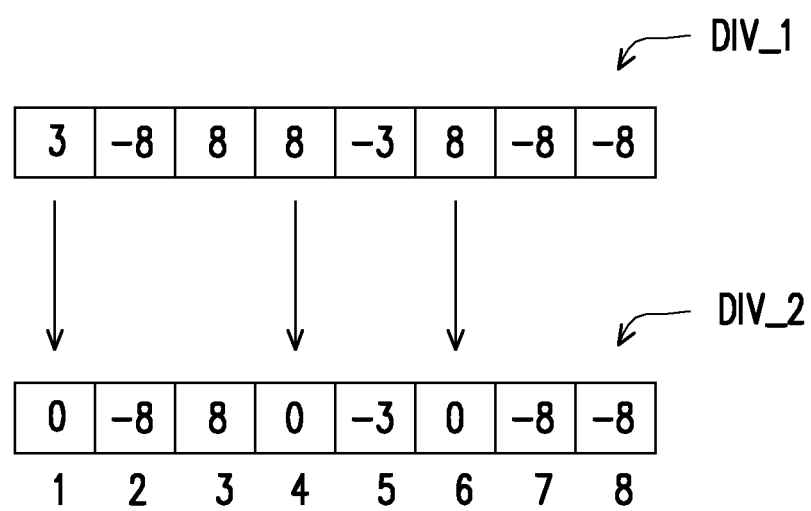
FIG. 19 is a schematic diagram illustrating setting a decoding parameter of an HRE bit to a specific decoding parameter according to an exemplary embodiment of the invention.

In more detail, FIG. 19 is a schematic diagram illustrating setting a decoding parameter of an HRE bit to a specific decoding parameter according to an exemplary embodiment of the invention.

Referring to FIG. 19, continuing the example of FIG. 17, it is assumed that in the aforementioned first decoding operation, the decoding initial value DIV_1 of the data in the center PPU MP1 for soft bit decoding is "3 −8 8 8 −3 8 −8 −8". It is assumed that the first, fourth, and sixth bits in the center PPU MP1 (i.e., the CSBs of the memory cells C1, C4, and C6) are identified as the HRE bits, the MMC 702 would set the LLRs of the first, fourth, and sixth bits in the PPU MP1 to a specific value (for example, 0) respectively to generate a decoding initial value DIV_2. The decoding initial value DIV_2 is "0 −8 8 0 −3 0−8 −8". The MMC 702 would perform the soft bit decoding again according to the decoding initial value DIV_2 and the data in the center PPU MP1 to try to obtain the respective values of the data in the decoded center PPU MP1. In particular, adjusting the LLR of the HRE bit to the specific value (for example, lowering the LLR) can prevent the HRE bit from affecting the decoding of other bits during the decoding process, thereby improving the probability of success in decoding.

It should be noted that, in the embodiment of FIG. 19 described above, if a bit is identified as the HRE bit, the MMC 702 adjusts the decoding parameter corresponding to the bit used in previous decoding operation to the specific decoding parameter and performs the decoding operation again according to the specific decoding parameter. However, the present invention is not limited thereto. In other embodiments, if one bit is identified as the HRE bit, the MMC 702 may also directly flip the value of the bit (e.g., "0") to another value (for example, "1"). For example, if the MMC 702 identifies the CSB of the memory cell C1 in FIG. 16 (i.e., the first bit of the center PPU MP1) as the HRE bit by the aforementioned method, the MMC 702 may also flip the CSB of the memory cell C1 directly to determine the original value (e.g., "1") of the CSB of the memory cell C1 as another value (e.g., "0", referred to herein as the fourth value).

It should be noted that the aforementioned example is used to determine whether the CSB of a memory cell is the HRE bit or not according to a decoded LSB and MSB of the memory cell, and adjust the decoding parameter corresponding to the CSB to the specific decoding parameter and perform the decode operation again if the CSB is the HRE bit. However, the present invention is not limited thereto. In another embodiment, it may determine whether the MSB of a memory cell is the HRE bit or not according to a decoded LSB and CSB of the memory cell, and adjust the decoding parameter corresponding to the MSB to the specific decoding parameter and perform the decode operation again if the MSB is the HRE bit. In addition, in another embodiment, it may determine whether the LSB of a memory cell is the HRE bit or not according to a decoded CSB and MSB of the memory cell, and adjust the decoding parameter corresponding to the LSB to the specific decoding parameter and perform the decode operation again if the LSB is the HRE bit. Further, although the above example is described in the TLC NAND flash memory, the present invention is not limited thereto. In other embodiments, the bit determining method described above can also be applied to the MLC NAND flash memory. The invention is also not intended to limit the type or the value of the specific decoding parameters described above.

Figure 20:
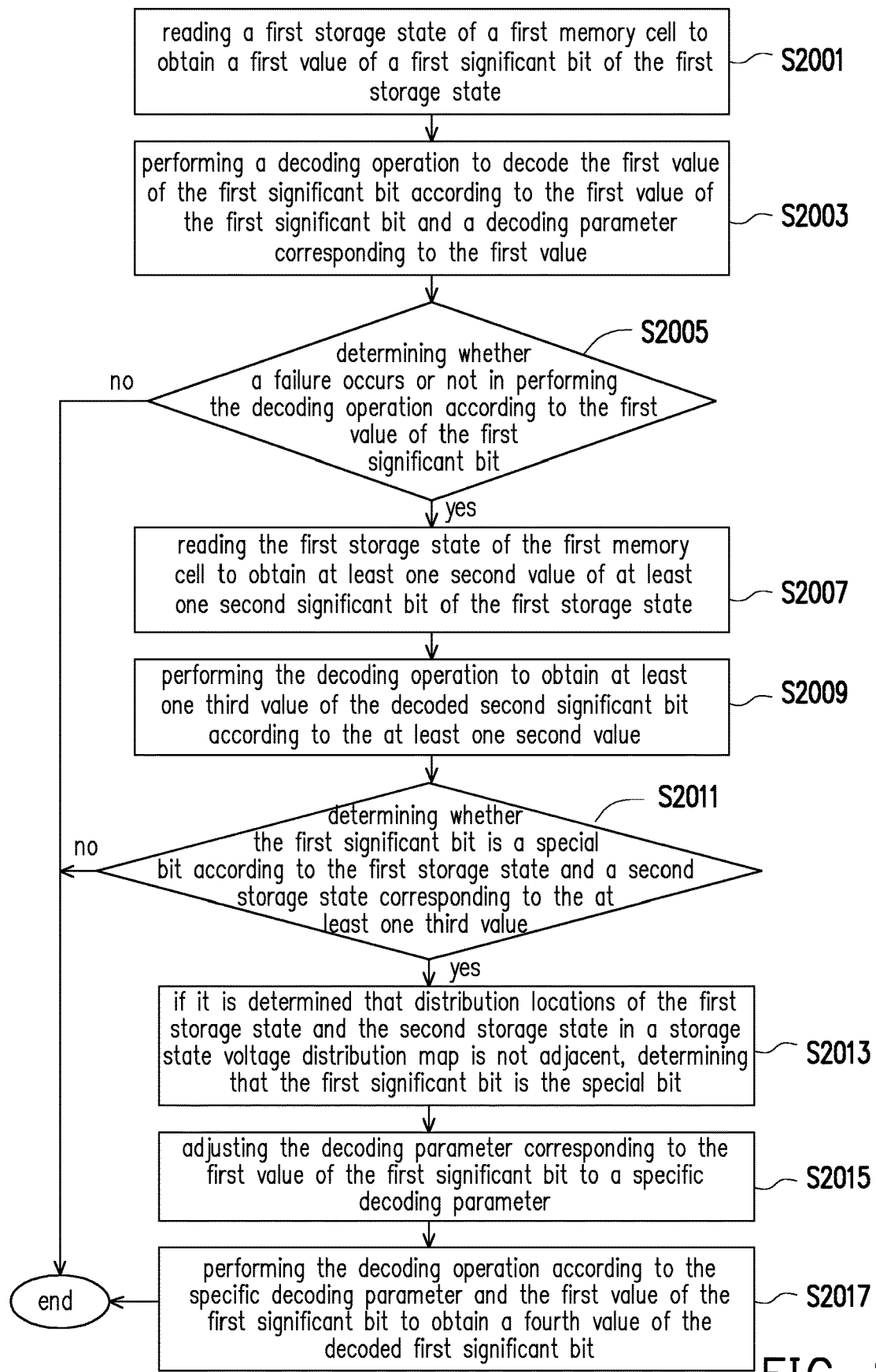
FIG. 20 is a flowchart of a bit determining method according to an exemplary embodiment of the invention.

FIG. 20 is a flowchart of a bit determining method according to an exemplary embodiment of the invention.

Referring to FIG. 20, in step S2001, the MMC 702 reads a first storage state of a first memory cell to obtain a first value of a first significant bit of the first storage state. In step S2003, the MMC 702 performs a decoding operation to decode the first value of the first significant bit according to the first value of the first significant bit and a decoding parameter corresponding to the first value. In step S2005, the MMC 702 determines whether a failure occurs or not in performing the decoding operation according to the first value of the first significant bit. If no failure has occurred, the flow of FIG. 20 is ended. However, if a failure occurred in performing the decoding operation according to the first value of the first significant bit, in step S2007, the MMC 702 reads the first storage state of the first memory cell to obtain at least one second value of at least one second significant bit of the first storage state. In step S2009, the MMC 702 performs the decoding operation to obtain at least one third value of the decoded second significant bit according to the at least one second value. In step S2011, the MMC 702 determines whether the first significant bit is a special bit according to the first storage state and a second storage state corresponding to the at least one third value. If it is determined that the distribution locations of the first storage state and the second storage state in the storage state voltage distribution map is adjacent, the MMC 702 determines that the first significant bit is not the special bit, thus ends the process of FIG. 20. However, if it is determined that the distribution location of the first storage state and the second storage state in the storage state voltage distribution map is not adjacent, in step S2013, the MMC 702 determines that the first significant bit is the special bit. Thereafter, in step S2015, the MMC 702 adjusts the decoding parameter corresponding to the first value of the first significant bit to a specific decoding parameter, and in step S2017, the MMC 702 performs the decoding operation according to the specific decoding parameter and the first value of the first significant bit to obtain a fourth value of the decoded first significant bit.

In summary, the bit determining method, the memory control circuit unit and the memory storage device of the present invention can be used to determine whether a bit in a data belongs to a special bit (for example, an HRE bit) or not. The memory controller may adjust the decoding parameter corresponding to the special bit to a specific decoding parameter according to the identified special bit, and perform the decoding operation again according to the value of the special bit and the specific decoding parameter to try to obtain the successful decoded codeword. In the above manner, not only the special bit (for example, a bit belonging to a specific error) in the data can be identified, but also the decoding parameter corresponding to the special bit can be adjusted to the specific decoding parameter, hereby preventing the special bit from affecting the decoding of other bits in the decoding process and improving the probability of success in decoding.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A bit determining method for a rewritable non-volatile memory module, wherein the rewritable non-volatile memory module comprises a plurality of memory cells, each of the plurality of memory cells has one of a plurality of storage states, each of the plurality of storage states having a plurality of significant bits, the bit determining method comprises:
    reading, by a memory management circuit, a first storage state of a first memory cell in the plurality of memory cells to obtain a first value of a first significant bit of the first storage state;
    reading, by the memory management circuit, the first storage state of the first memory cell to obtain at least one second value of at least one second significant bit of the first storage state;
    performing, by an error checking and correcting circuit, a first decoding operation according to the at least one second value to obtain at least one third value of the decoded second significant bit;
    determining, by the memory management circuit, whether the first significant bit is a special bit according to the first storage state and a second storage state corresponding to the at least one third value; and
    if the first significant bit is the special bit, performing, by the error checking and correction circuit, a corresponding decoding operation.

2. The bit determining method of claim 1, wherein if the plurality of storage states are distributed in a storage state voltage distribution map according to a sequence, the method further comprises:
    if it is determined that distribution locations of the first storage state and the second storage state in the storage state voltage distribution map is not adjacent, determining that the first significant bit is the special bit.

3. The bit determining method of claim 2, wherein before the step of reading the first storage state of the first memory cell to obtain the at least one second value of the at least one second significant bit of the first storage state, the method further comprises:
    performing a second decoding operation according to the first value of the first significant bit; and
    if a failure occurs in performing the second decoding operation according to the first value of the first significant bit, performing the step of reading the first storage state of the first memory cell to obtain the at least one second value of the at least one second significant bit of the first storage state.

4. The bit determining method of claim 3, wherein the step of performing the corresponding decoding operation comprises:
    adjusting a decoding parameter corresponding to the first value of the first significant bit to a specific decoding parameter, wherein the decoding parameter is used to decode the first value of the first significant bit in the second decoding operation; and
    performing a third decoding operation according to the specific decoding parameter and the first value of the first significant bit to obtain a fourth value of the decoded first significant bit.

5. The bit determining method of claim 4, wherein the first decoding operation, the second decoding operation, and the third decoding operation are soft bit decoding operations.

6. The bit determining method according to claim 5, wherein the decoding parameter and the specific decoding parameter are Log Likelihood Ratios in the soft bit decoding operations.

7. The bit determining method according to claim 3, wherein after the step of determining that the first significant bit is the special bit, the method further comprises:
    determining that the first significant bit is a fourth value, wherein the fourth value is different from the first value.

8. The bit determining method according to claim 1, wherein the rewritable non-volatile memory module comprises a plurality of word lines, and the plurality of memory cells are disposed on intersections of the plurality of word lines and a plurality of bit lines, wherein
    the first memory cell is located on a first word line of the plurality of word lines, and other memory cells located on the first word line and the first memory cell form a physical programming unit group, a first physical programming unit in the physical programming unit group is configured to store the first value, at least one second physical programming unit in the physical programming unit group is configured to store the at least one second value and the first physical programming unit is different from the at least one second physical programming unit.

9. A memory control circuit unit, adapted to a rewritable non-volatile memory module, wherein the rewritable non-volatile memory module comprises a plurality of memory cells, each of the plurality of memory cells has one of a plurality of storage states, each of the plurality of storage states having a plurality of significant bits, the memory control circuit unit comprising:
    a host interface, coupled to a host system;
    a memory interface, coupled to the rewritable non-volatile memory module; and
    a memory management circuit, coupled to the host interface and the memory interface,
    wherein the memory management circuit is configured to read a first storage state of a first memory cell in the plurality of memory cells to obtain a first value of a first significant bit of the first storage state, wherein the memory management circuit is further configured to read the first storage state of the first memory cell to obtain at least one second value of at least one second significant bit of the first storage state, wherein the memory management circuit is further configured to perform a first decoding operation according to the at least one second value to obtain at least one third value of the decoded second significant bit, wherein the memory management circuit is further configured to determine whether the first significant bit is a special bit according to the first storage state and a second storage state corresponding to the at least one third value, and if the first significant bit is the special bit, the memory management circuit is further configured to perform a corresponding decoding operation.

10. The memory control circuit unit as claimed in claim 9, wherein if the plurality of storage states are distributed in a storage state voltage distribution map according to a sequence, if it is determined that distribution locations of the first storage state and the second storage state in the storage state voltage distribution map is not adjacent, the memory management circuit is further configured to determine that the first significant bit is the special bit.

11. The memory control circuit unit as claimed in claim 10, wherein before the operation of reading the first storage state of the first memory cell to obtain the at least one second value of the at least one second significant bit of the first storage state, the memory management circuit is further configured to perform a second decoding operation according to the first value of the first significant bit, and if a failure occurs in performing the second decoding operation according to the first value of the first significant bit, the memory management circuit is further configured to perform the operation of reading the first storage state of the first memory cell to obtain the at least one second value of the at least one second significant bit of the first storage state.

12. The memory control circuit unit as claimed in claim 11, wherein in the operation of performing the corresponding decoding operation, the memory management circuit is further configured to adjust a decoding parameter corresponding to the first value of the first significant bit to a specific decoding parameter, wherein the decoding parameter is used to decode the first value of the first significant bit in the second decoding operation, and the memory management circuit is further configured to perform a third decoding operation according to the specific decoding parameter and the first value of the first significant bit to obtain a fourth value of the decoded first significant bit.

13. The memory control circuit unit as claimed in claim 12, wherein the first decoding operation, the second decoding operation, and the third decoding operation are soft bit decoding operations.

14. The memory control circuit unit as claimed in claim 13, wherein the decoding parameter and the specific decoding parameter are Log Likelihood Ratios in the soft bit decoding operations.

15. The memory control circuit unit as claimed in claim 11, wherein after the operation of determining that the first significant bit is the special bit, the memory management circuit is further configured to determine that the first significant bit is a fourth value, wherein the fourth value is different from the first value.

16. The memory control circuit unit as claimed in claim 9, wherein the rewritable non-volatile memory module comprises a plurality of word lines, and the plurality of memory cells are disposed on intersections of the plurality of word lines and a plurality of bit lines, wherein the first memory cell is located on a first word line of the plurality of word lines, and other memory cells located on the first word line and the first memory cell form a physical programming unit group, a first physical programming unit in the physical programming unit group is configured to store the first value, at least one second physical programming unit in the physical programming unit group is configured to store the at least one second value and the first physical programming unit is different from the at least one second physical programming unit.

17. A memory storage device, comprising:

a connection interface unit, coupled to a host system;

a rewritable non-volatile memory module, having a plurality of memory cells, each of the plurality of memory cells has one of a plurality of storage states, each of the plurality of storage states having a plurality of significant bits; and a memory control circuit unit, coupled to the connection interface unit and the rewritable non-volatile memory module, wherein the memory control circuit unit is configured to read a first storage state of a first memory cell in the plurality of memory cells to obtain a first value of a first significant bit of the first storage state, wherein the memory control circuit unit is further configured to read the first storage state of the first memory cell to obtain at least one second value of at least one second significant bit of the first storage state, wherein the memory control circuit unit is further configured to perform a first decoding operation according to the at least one second value to obtain at least one third value of the decoded second significant bit, wherein the memory control circuit unit is further configured to determine whether the first significant bit is a special bit according to the first storage state and a second storage state corresponding to the at least one third value, and if the first significant bit is the special bit, the memory control circuit unit is further configured to perform a corresponding decoding operation.

18. The memory storage device as claimed in claim 17, wherein if the plurality of storage states are distributed in a storage state voltage distribution map according to a sequence, if it is determined that distribution locations of the first storage state and the second storage state in the storage state voltage distribution map is not adjacent, the memory control circuit unit is further configured to determine that the first significant bit is the special bit.

19. The memory storage device as claimed in claim 18, wherein before the operation of reading the first storage state of the first memory cell to obtain the at least one second value of the at least one second significant bit of the first storage state, the memory control circuit unit is further configured to perform a second decoding operation according to the first value of the first significant bit, and if a failure occurs in performing the second decoding operation according to the first value of the first significant bit, the memory control circuit unit is further configured to perform the operation of reading the first storage state of the first memory cell to obtain the at least one second value of the at least one second significant bit of the first storage state.

20. The memory storage device as claimed in claim 19, wherein in the operation of performing the corresponding decoding operation, the memory control circuit unit is further configured to adjust a decoding parameter corresponding to the first value of the first significant bit to a specific decoding parameter, wherein the decoding parameter is used to decode the first value of the first significant bit in the second decoding operation, and the memory control circuit unit is further configured to perform a third decoding operation according to the specific decoding parameter and the first value of the first significant bit to obtain a fourth value of the decoded first significant bit.

21. The memory storage device as claimed in claim 20, wherein the first decoding operation, the second decoding operation, and the third decoding operation are soft bit decoding operations.

22. The memory storage device as claimed in claim 21, wherein the decoding parameter and the specific decoding parameter are Log Likelihood Ratios in the soft bit decoding operations.

23. The memory storage device as claimed in claim 19, wherein after the operation of determining that the first significant bit is the special bit, the memory control circuit unit is further configured to determine that the first significant bit is a fourth value, wherein the fourth value is different from the first value.

24. The memory storage device as claimed in claim 17, wherein the rewritable non-volatile memory module comprises a plurality of word lines, and the plurality of memory cells are disposed on intersections of the plurality of word lines and a plurality of bit lines, wherein the first memory cell is located on a first word line of the plurality of word lines, and other memory cells located on the first word line and the first memory cell form a physical programming unit group, a first physical programming unit in the physical programming unit group is configured to store the first value, at least one second physical programming unit in the physical programming unit group is configured to store the at least one second value and the first physical programming unit is different from the at least one second physical programming unit.

* * * * *